(12) United States Patent
Takase et al.

(10) Patent No.: US 12,349,485 B2
(45) Date of Patent: Jul. 1, 2025

(54) IMAGING DEVICE

(71) Applicant: Panasonic Intellectual Property Management Co., Ltd., Osaka (JP)

(72) Inventors: Masayuki Takase, Osaka (JP); Shunsuke Isono, Osaka (JP); Yuuko Tomekawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/625,946

(22) Filed: Apr. 3, 2024

(65) Prior Publication Data

US 2024/0274626 A1 Aug. 15, 2024

Related U.S. Application Data

(63) Continuation of application No. 17/028,627, filed on Sep. 22, 2020, now Pat. No. 11,996,422, which is a
(Continued)

(30) Foreign Application Priority Data

Apr. 4, 2018 (JP) .................................. 2018-072409

(51) Int. Cl.
*H10F 39/00* (2025.01)
(52) U.S. Cl.
CPC ......... *H10F 39/803* (2025.01); *H10F 39/811* (2025.01)

(58) Field of Classification Search
CPC ............... H01L 21/822; H01L 21/8258; H01L 21/8234; H01L 27/14609; H01L 27/146;
(Continued)

(56) References Cited

U.S. PATENT DOCUMENTS 8,258,039 B2 9/2012 Inoue
9,312,327 B2 4/2016 Ozawa et al.
(Continued)

FOREIGN PATENT DOCUMENTS

JP 2004-023033 A 1/2004
JP 2004-327770 A 11/2004
(Continued)

OTHER PUBLICATIONS

International Search Report of PCT application No. PCT/JP2018/045241 dated Feb. 12, 2019.
(Continued)

*Primary Examiner* — Nikolay K Yushin
(74) *Attorney, Agent, or Firm* — Rimon P.C.

(57) ABSTRACT

An electronic device includes: a capacitor; an insulating layer; at least one trench provided in the insulating layer; and a first conductive plug, at least part of which is surrounded by the insulating layer. The capacitor includes: a first lower electrode provided along an inner wall of the at least one trench, a dielectric layer provided on the first lower electrode, and an upper electrode provided on the dielectric layer. At least part of the first conductive plug is positioned between an upper surface of the insulating layer and a lowermost portion of the at least one trench.

13 Claims, 12 Drawing Sheets

Related U.S. Application Data continuation of application No. PCT/JP2018/045241, filed on Dec. 10, 2018.

(58) Field of Classification Search
CPC ......... H01L 27/14636; H01L 27/14665; H01L 27/04; H01L 27/06; H01L 27/088; H01L 27/14634; H04N 25/00; H04N 25/70; H04N 25/75; H04N 25/79; H04N 25/778; H04N 25/17; H04N 25/76; H04N 25/77; H04N 25/779; H04N 25/78; H10F 39/803; H10F 39/00; H10F 39/811; H10F 39/191; H10F 39/12; H10F 39/809; H10D 84/0126; H10D 84/01; H10D 84/00; H10D 84/038; H10D 84/03; H10D 84/83
See application file for complete search history.

(56) References Cited

U.S. PATENT DOCUMENTS

| | | | |
|---|---|---|---|
| 10,038,864 B2* | 7/2018 | Akiyama | H04N 25/704 |
| 10,547,016 B2* | 1/2020 | Tashiro | H01L 31/0224 |
| 11,189,520 B2* | 11/2021 | Mizuta | H01L 21/822 |
| 2010/0167452 A1 | 7/2010 | Kim | |
| 2011/0001216 A1 | 1/2011 | Inoue | |
| 2011/0049600 A1 | 3/2011 | Aoki | |
| 2013/0001403 A1 | 1/2013 | Yamakawa | |
| 2015/0060968 A1 | 3/2015 | Sa et al. | |
| 2015/0380480 A1 | 12/2015 | Ozawa et al. | |
| 2016/0191825 A1 | 6/2016 | Sato et al. | |
| 2016/0293654 A1 | 10/2016 | Tomekawa et al. | |
| 2019/0067612 A1* | 2/2019 | Tashiro | H10K 39/32 |
| 2019/0122918 A1* | 4/2019 | Mizuta | H01L 27/04 |

FOREIGN PATENT DOCUMENTS

| | | |
|---|---|---|
| JP | 2007-059761 A | 3/2007 |
| JP | 2008-047931 A | 2/2008 |
| JP | 2009-536791 A | 10/2009 |
| JP | 2011-049250 A | 3/2011 |
| JP | 2013-021533 A | 1/2013 |
| JP | 2013-168548 A | 8/2013 |
| JP | 2015-050463 A | 3/2015 |
| JP | 2016-009781 A | 1/2016 |
| JP | 2016-076921 A | 5/2016 |
| JP | 2016-127265 A | 7/2016 |
| JP | 2016-197617 A | 11/2016 |
| WO | 2007/133936 A1 | 11/2007 |
| WO | 2017/169882 A1 | 10/2017 |

OTHER PUBLICATIONS

Non-Final Office Action dated Aug. 2, 2023 issued in U.S. Appl. No. 17/028,627.
Final Office Action dated Oct. 31, 2023 issued in U.S. Appl. No. 17/028,627.
Notice of Allowance dated Jan. 18, 2024 issued in U.S. Appl. No. 17/028,627.
English Translation of Chinese Search Report dated Mar. 21, 2024 for the related Chinese Patent Application No. 201880087504.8.
English Translation of TW Search Report dated Nov. 1, 2024 for the related TW Patent Application No. 112140382.

* cited by examiner

IMAGING DEVICE

CROSS-REFERENCE TO RELATED APPLICATIONS

This application is a Continuation of U.S. patent application Ser. No. 17/028,627, filed on Sep. 22, 2020, which is a Continuation of International Patent Application No. PCT/JP2018/045241, filed on Dec. 10, 2018, which claims priority to Japanese Patent Application No. 2018-072409, filed on Apr. 4, 2018, the entire disclosures each of which are hereby incorporated by reference.

BACKGROUND

1. Technical Field

The present disclosure relates to an electronic device.

2. Description of the Related Art

Japanese Unexamined Patent Application Publication No. 2016-76921 discloses an imaging device that can perform high dynamic range imaging by providing a pixel section with a capacitor.

SUMMARY

In one general aspect, the techniques disclosed here feature an electronic device including: a capacitor; an insulating layer; at least one trench provided in the insulating layer; and a first conductive plug, at least part of which is surrounded by the insulating layer. The capacitor includes: a first lower electrode provided along an inner wall of the at least one trench, a dielectric layer provided on the first lower electrode, and an upper electrode provided on the dielectric layer. At least part of the first conductive plug is positioned between an upper surface of the insulating layer and a lowermost portion of the at least one trench.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Summary of the Present Disclosure

Figure 1:
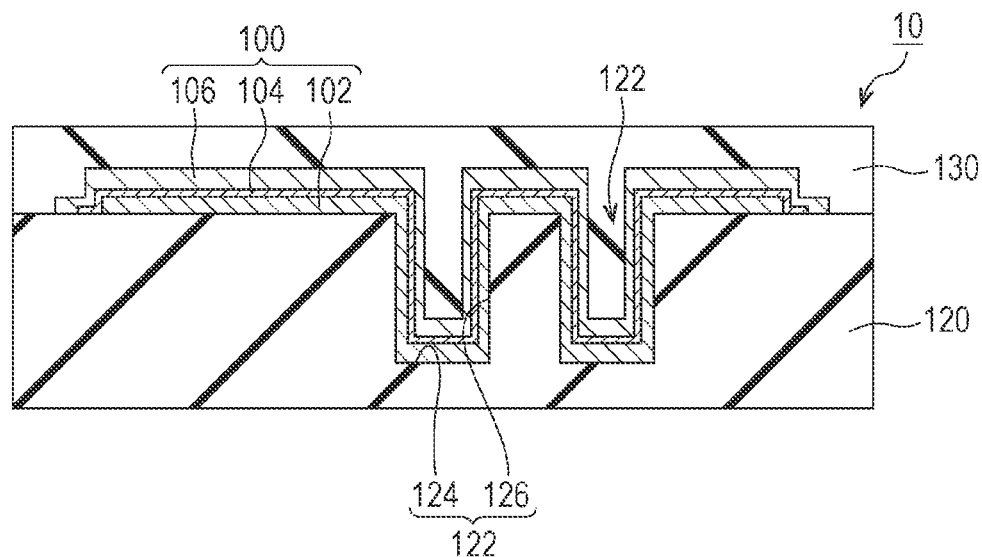
FIG. 1 is a cross-sectional view of a capacitor and its vicinity, the capacitor being included in an electronic device according to a first embodiment.

First, a summary of an aspect of the present disclosure will be described before a detailed description of an embodiment of the present disclosure is given. The summary of an aspect of the present disclosure is as follows.

An electronic device according to an aspect of the present disclosure includes: a capacitor; an insulating layer; at least one trench provided in the insulating layer; and a first conductive plug, at least part of which is surrounded by the insulating layer. The capacitor includes: a first lower electrode provided along an inner wall of the at least one trench, a dielectric layer provided on the first lower electrode, and an upper electrode provided on the dielectric layer. At least part of the first conductive plug is positioned between an upper surface of the insulating layer and a lowermost portion of the at least one trench.

Thus, since the first lower electrode of the capacitor is provided along the inner wall of the trench, the capacity of the capacitor can be increased without increasing the area of the capacitor in a plan view. Thus, it is possible to implement an electronic device including a capacitor having a large capacity with a limited area in a plan view, in other words, with a saved area. Consequently, according to the present aspect, it is possible to provide a small-sized electronic device including a capacitor having a large capacity.

In addition, since at least part of the first conductive plug is positioned laterally of the trench, the capacitor can be electrostatically shielded from other capacitors or wires. Therefore, capacitive coupling caused by capacitors can be reduced, and the reliability of the operation of the electronic device can be enhanced.

In addition, for instance, the at least one trench may include a plurality of trenches, and the first lower electrode may be provided along an inner wall of each of the plurality of trenches and the upper surface of the insulating layer.

Thus, since the plurality of trenches are provided, the capacity of the capacitor can be further increased.

In addition, for instance, the capacitor may further include a second lower electrode provided between the upper surface of the insulating layer and the first lower electrode. The second lower electrode may be provided with an opening which is open to an upper portion of the at least one trench, and the first lower electrode may continuously cover the inner wall of the at least one trench and the second lower electrode.

In addition, for instance, at least part of the second lower electrode may overlap with the first conductive plug in a plan view, and the first conductive plug may be connected to the second lower electrode.

Thus, since the second lower electrode is positioned directly above the first conductive plug, diffusion of metal atoms contained in the first conductive plug followed by exposure of the metal atoms to the surface can be reduced. Because diffusion of the metal atoms is reduced, the occurrence of a failure in a process of forming the capacitor and reliability degradation of the operation of the electronic device can be reduced.

For instance, when a trench is patterned in a process of forming the capacitor, oxygen ashing treatment with a high resist removal capability may be used. When metal atoms are exposed to the surface at the time of oxygen ashing treatment, unusual oxidation of the metal atoms may occur. According to the present aspect, the occurrence of unusual oxidation can also be reduced because diffusion of the metal atoms is reduced by the second lower electrode.

In addition, for instance, the electronic device according to the present disclosure may further include: a photoelectric converter that converts incident light to an electric charge; and a diffusion region that stores the electric charge. The second lower electrode may be connected to the diffusion region via the first conductive plug.

Thus, since the capacitor stores the electric charge generated by the photoelectric converter, the saturation level of electric charge in the photoelectric converter can be increased, as compared with when the capacitor is not connected to the photoelectric converter. In other words, the critical intensity of light convertible to electric power can be increased, thus the dynamic range of the electronic device as an imaging device can be increased.

In addition, for instance, the electronic device according to the present disclosure may further include: a pixel electrode connected to the photoelectric converter; a second conductive plug that overlaps with the pixel electrode in a plan view, and that is connected to the pixel electrode; and a conductive layer that connects the second conductive plug and the first conductive plug. The photoelectric converter may be positioned above the capacitor.

Thus, the first conductive plug is connected from the pixel electrode to the lower side of the second lower electrode via the second conductive plug and the semiconductor layer. For instance, when a plurality of capacitors are provided, wide formation of the upper electrode to cover the first lower electrode ensures a long distance between two or more adjacent first lower electrodes. Therefore, the occurrence of capacitive coupling between first lower electrodes can be reduced.

If capacitive coupling occurs between the electrodes of two or more adjacent capacitors, the amount of electric charge stored in the capacitors may vary. When the electronic device is a two-dimensional image sensor that generates a static image or a dynamic image, the image quality may deteriorate due to variation in the amount of the electric charge stored in the capacitors.

In contrast, in the electronic device according to the present aspect, the occurrence of capacitive coupling is reduced, thus variation in the amount of the electric charge stored in the capacitors is reduced. Therefore, when the electronic device is a two-dimensional image sensor, deterioration of the image quality can be reduced.

In addition, for instance, at least part of the conductive layer may be positioned between the lowermost portion of the at least one trench and the second lower electrode.

Thus, since the conductive layer is provided using the space laterally of the trench, the electronic device can be reduced in height. In other words, in the present aspect, not only reduction in the area of the electronic device in a plan view, but also reduction in the height in a thick direction can be achieved. Thus, a more small-sized electronic device is achieved.

In addition, for instance, the electronic device according to the present disclosure may further include: a semiconductor substrate; and a multi-layer wiring layer which is provided above the semiconductor substrate, and which includes a plurality of insulating layers and a plurality of wiring layers. The plurality of insulating layers may include the insulating layer, and the plurality of wiring layers may include a first wiring layer provided between the upper surface of the insulating layer and the semiconductor substrate.

In general, in the vicinity of the semiconductor substrate, a plurality of wires are provided and the density of wires occupying the space is high. In the present aspect, capacitors are provided at a position which is away from the semiconductor substrate and has a relatively low wiring density, thus the degree of freedom of layout of the capacitors is increased. For instance, larger capacitors or a deeper trench can be formed, thus the capacity of the capacitors can be further increased.

In addition, for instance, the electronic device may be an imaging device that includes a pixel region including a plurality of pixels disposed side by side, and a peripheral circuit for driving the plurality of pixels, and the first wiring layer may include part of a first signal line which is connected to two or more of the plurality of pixels, and which extends outwardly of the pixel region.

Thus, for instance, when a capacitor and a photoelectric converter are connected, electric charge can be stored in the capacitor, thus the saturation level of electric charge in the photoelectric converter can be increased. In other words, the critical intensity of light convertible to electric power can be increased, thus the dynamic range of the electronic device as an imaging device can be increased.

In addition, for instance, the plurality of wiring layers may further include a second wiring layer provided between the first wiring layer and the semiconductor substrate, and the second wiring layer may include part of a second signal line which is connected to two or more of the plurality of pixels, and which extends outwardly of the pixel region.

Thus, since at least two wiring layers are positioned between the upper surface of the insulating layer and the semiconductor substrate, the capacitors are provided at a position further away from the semiconductor substrate. Therefore, the degree of freedom of layout of the capacitors is increased, thus enlargement of the capacity of the capacitors can be easily achieved.

In addition, for instance, the first wiring layer may be provided between the lowermost portion of the at least one trench and the semiconductor substrate.

Thus, since at least one wiring layer is positioned between the lowermost portion of the trench and the semiconductor substrate, the capacitors are provided at a position away from the semiconductor substrate. Therefore, the degree of freedom of layout of the capacitors is increased, thus enlargement of the capacity of the capacitors can be easily achieved.

In the present disclosure, all or a part of any of circuit, unit, device, part or portion, or any of functional blocks in the block diagrams may be implemented as one or more of electronic circuits including, but not limited to, a semiconductor device, a semiconductor integrated circuit (IC) or an LSI. The LSI or IC can be integrated into one chip, or also can be a combination of plural chips. For example, functional blocks other than a memory may be integrated into one chip. The name used here is LSI or IC, but it may also be called system LSI, VLSI (very large scale integration), or ULSI (ultra large scale integration) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or a part of the functions or operations of the circuit, unit, device, part or portion are implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.)

Hereinafter, an embodiment will be described with reference to the drawings.

It is to be noted that each of the embodiments described below illustrates a comprehensive or specific example. The numerical values, shapes, materials, components, arrangement positions and connection configurations of the components, steps, the order of the steps shown in the following embodiments each provide an example, and are not intended to limit the present disclosure.

It is to be noted that the figures are schematic diagrams and are not necessarily precise illustrations. Therefore, for instance, the scales used in the figures are not necessarily the same. Furthermore, in the figures, the same reference sign is given to substantially identical components, and a redundant description is omitted or simplified.

In addition, in the present disclosure, a term indicating a relationship between components, such as parallel or perpendicular, a term indicating the shape of a component, such as a rectangle, and a numeric range refer to not only an expression which has a strict meaning, but also an expression which allows inclusion of a substantially equivalent range, for instance, a difference of several %.

In addition, the terms "above" and "below" in the present disclosure do not refer to an upper direction (vertically upward) and a lower direction (vertically downward) in absolute space recognition, but are used as terms that are each defined by a relative positional relationship based on the order of layers in a layered structure. Also, the terms "above" and "below" are used not only when two components are disposed with an interval and another component is present between the two components, but also when two components are disposed in close contact with each other, and the two components are in contact.

Also, in the present disclosure, the terms "directly above" and "directly below" mean not only "above" and "below" which are each an upper or lower relationship in a layer direction, but also partial overlap of components in a plan view. For instance, "A is positioned directly above B" means that A is positioned above B and at least part of A overlaps with B in a plan view.

Similarly, when A is positioned above B, "C is positioned between A and B" means that C is positioned below A and above B. C may be positioned or may not be positioned directly below A. C may be positioned or may not be positioned directly above B.

It is to be noted that "in a plan view" means viewing in an upper or lower direction, and specifically means that viewing the major surface of the semiconductor substrate from the front side.

First Embodiment

First, a first embodiment will be described with reference to FIG. 1. FIG. 1 is a cross-sectional view of a capacitor 100 and its vicinity, the capacitor 100 being included in an electronic device 10 according to the present embodiment.

As illustrated in FIG. 1, the electronic device 10 includes a capacitor 100, an insulating layer 120, and an insulating layer 130. The electronic device 10 is, for instance, an imaging device or a storage device. Although not illustrated, the electronic device 10 is, for instance, a semiconductor substrate.

In the present embodiment, the capacitor 100 is provided above a semiconductor substrate (not illustrated) included in the electronic device 10. Specifically, as illustrated in FIG. 1, the capacitor 100 is provided above the insulating layer 120 included in the electronic device 10.

The insulating layer 120 is one of multiple insulating layers included in the multi-layer wiring layer provided above the semiconductor substrate. The insulating layer 120 is formed using, for instance, a translucent insulating material, such as silicon oxide (SiOx) or silicon nitride (SiNx).

As illustrated in FIG. 1, the insulating layer 120 is provided with a trench 122. The trench 122 has a base portion 124 and a lateral wall portion 126. The base portion 124 is a flat face parallel to the upper surface of the insulating layer 120. The lateral wall portion 126 is a flat face which intersects the base portion 124 perpendicularly or diagonally. Alternatively, at least one of the base portion 124 and the lateral wall portion 126 may be a curved face. It is to be noted that in the trench 122, two lateral wall portions 126 may intersect diagonally so as to form a V-shaped groove. In other words, the trench 122 may not have the base portion 124.

As illustrated in FIG. 1, the cross-sectional shape of the trench 122 is a rectangle having a longer length in the depth direction. However, this is not always the case, and the cross-sectional shape of the trench 122 may be an inverted trapezoid having a longer length in the depth direction. Alternatively, the cross-sectional shape of the trench 122 may be a V shape or a U shape having a longer length in the depth direction. The cross-sectional shape of the trench 122 may have a longer length in the width direction.

The depth of the trench 122 is greater than, for instance, the depth of a lower electrode 102 or an upper electrode 106 of the capacitor 100. For instance, the depth of the trench 122 is 100 nm or greater and 1 μm or less.

In the present embodiment, the insulating layer 120 is provided with multiple trenches 122. Although FIG. 1 illustrates two trenches 122 provided in the insulating layer 120, the number of trenches 122 may be greater than or equal to three. Alternatively, the insulating layer 120 may be provided with only one trench 122.

In the present embodiment, as illustrated in FIG. 1, an insulating layer 130 that covers the capacitor 100 is provided. In other words, the capacitor 100 is provided to be inserted between the insulating layer 120 and the insulating layer 130. The insulating layer 130 is one of multiple insulating layers included in the multi-layer wiring layer. The insulating layer 130 is formed using, for instance, a translucent insulating material, such as silicon oxide or silicon nitride. The insulating layer 130 may have a single-layer structure or may have a multi-layer structure.

As illustrated in FIG. 1, the capacitor 100 includes the lower electrode 102, a dielectric layer 104, and the upper electrode 106. The capacitor 100 has a so-called Metal-Insulator-Metal (MIM) structure.

The lower electrode 102 is an example of the first lower electrode provided along the inner walls of the trenches 122. The lower electrode 102 is provided along the inner wall of each of the multiple trenches 122 and the upper surface of the insulating layer 120. Specifically, the lower electrode 102 is provided along the base portion 124 and the lateral wall portion 126 of each of the trenches 122 with a substantially uniform film thickness. In other words, the upper surface of the lower electrode 102 forms a trench having a depth shorter than that of the trench 122 by a thickness corresponding to the film thickness of the lower electrode 102. The film thickness of the lower electrode 102 is, for instance, 15 nm, however, this is not always the case.

As illustrated in FIG. 1, the lower electrode 102 continuously covers the upper surface of the insulating layer 120, the lateral wall portions 126, and the base portions 124. Here, continuously means that the lower electrode 102 is not disconnected in the middle. Specifically, the lower electrode 102 is not provided with a through hole.

In the present embodiment, the film thickness of the lower electrode 102 differs between the flat portions positioned on the upper surface of the insulating layer 120 and the portions in the trenches 122. Specifically, the film thickness of the flat portions is greater than the film thickness of the portions in the trenches 122. The width of the trenches 122 can be narrowed by reducing the film thickness of the portions in the trenches 122. Thus, enlargement of the capacity of the capacitor 100 can be easily achieved with a smaller area.

The lower electrode 102 is formed using a conductive material, such as metal or metallic compound. As the conductive material, metal simple substance, such as titanium (Ti), aluminum (Al), aurum (Au), or platinum (Pt), or a metal alloy of two or more of these is used. Alternatively, as the conductive material, a conductive metal nitride, such as titanium nitride (TiN), tantalum nitride (TaN) or hafnium nitride (HfN), may be used.

The dielectric layer 104 is provided on the lower electrode 102. Specifically, the dielectric layer 104 is in contact with the upper surface of the lower electrode 102, and is formed along the upper surface of the lower electrode 102 with a substantially uniform film thickness. In other words, similarly to the upper surface of the lower electrode 102, the upper surface of the dielectric layer 104 also forms a trench having a depth shorter than that of the trench 122 by a thickness corresponding to the total film thickness of the lower electrode 102 and the dielectric layer 104. The film thickness of the dielectric layer 104 is, for instance, 10 nm or greater, and is 20 nm as an example. However, this is not always the case.

The dielectric layer 104 is formed using a so-called high-k material having a dielectric constant higher than that of silicon oxide, for instance. Specifically, the dielectric layer 104 contains oxide of hafnium (Hf) or oxide of zirconium (Zr) as the main component. Specifically, the dielectric layer 104 contains oxide of hafnium or oxide of zirconium with 50 mol % or higher. Alternatively, the dielectric layer 104 may be formed using aluminum oxide ($Al_2O_3$).

In the present embodiment, the dielectric layer 104 completely covers the lower electrode 102. Specifically, the lower electrode 102 is positioned inside of the dielectric layer 104 in a plan view. As illustrated in FIG. 1, each end of the dielectric layer 104 is positioned outside of a corresponding end of the lower electrode 102, and is provided on the upper surface of the insulating layer 120. The dielectric layer 104 covers the lower electrode 102, thus the occurrence of a short circuit between the lower electrode 102 and the upper electrode 106 can be reduced.

The upper electrode 106 is provided on the dielectric layer 104. Specifically, the upper electrode 106 is in contact with the upper surface of the dielectric layer 104 and is formed along the upper surface of the dielectric layer 104 with a substantially uniform film thickness. In other words, similarly to the upper surface of the lower electrode 102 and the upper surface of the dielectric layer 104, the upper surface of the upper electrode 106 also forms a trench having a depth shorter than that of each trench 122 by a thickness corresponding to the total film thickness of the lower electrode 102, the dielectric layer 104 and the upper electrode 106. It is to be noted that the upper electrode 106 may be formed so as to fill the trench 122. In other words, the upper surface of the upper electrode 106 may be a flat face parallel to the upper surface of the insulating layer 120.

The upper electrode 106 is formed using the same material as that of the lower electrode 102, for instance. Alternatively, the upper electrode 106 may be formed using a material different from that of the lower electrode 102.

In the present embodiment, the upper electrode 106 completely covers the dielectric layer 104. Specifically, the dielectric layer 104 is positioned inside of the upper electrode 106 in a plan view. As illustrated in FIG. 1, each end of the upper electrode 106 is positioned outside of a corresponding end of the dielectric layer 104, and is provided on the upper surface of the insulating layer 120.

As described above, in the present embodiment, the lower electrode 102 of the capacitor 100 is provided along the inner walls of the trenches 122, thus the capacity of the capacitor 100 can be increased without increasing the area of the capacitor 100 in a plan view. Thus, it is possible to implement the electronic device 10 including the capacitor 100 having a large capacity with a limited area in a plan view, in other words, with a saved area.

Modification of First Embodiment

Figure 2:
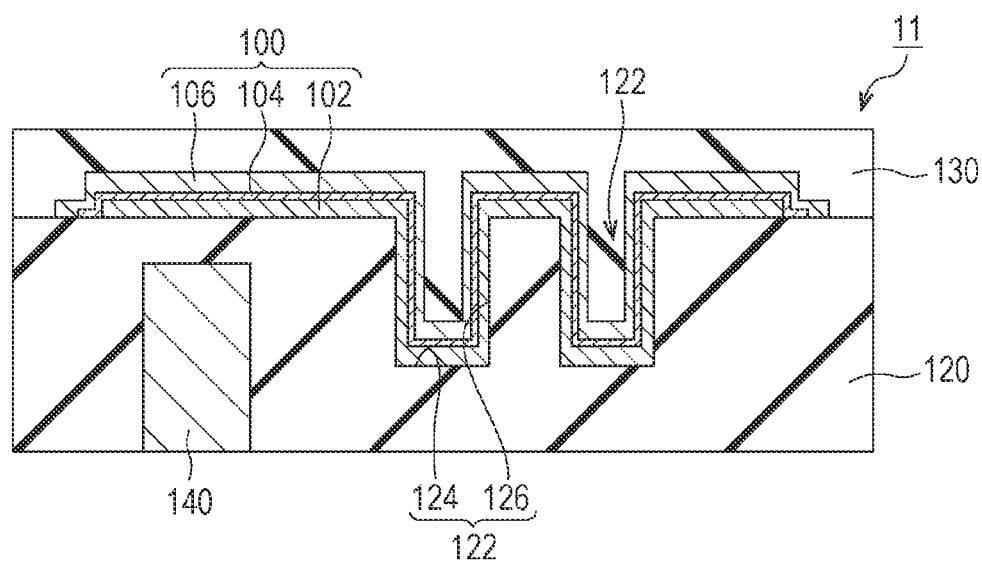
FIG. 2 is a cross-sectional view of a capacitor and its vicinity, the capacitor being included in an electronic device according to a modification of the first embodiment.

Here, a modification of the first embodiment will be described with reference to FIG. 2. FIG. 2 is a cross-sectional view of the capacitor 100 and its vicinity, the capacitor 100 being included in an electronic device 11 according to the present modification. It is to be noted that in the description of the present modification, a point of difference from the first embodiment will be mainly described, and a description of a common point is omitted or simplified.

As illustrated in FIG. 2, the electronic device 11 according to the present modification includes a conductive plug 140. The conductive plug 140 is an example of the first conductive plug, at least part of which is surrounded by the insulating layer 120.

At least part of the conductive plug 140 is positioned between the lowermost portion of the trench 122 and the upper surface of the insulating layer 120. In other words, at least part of the conductive plug 140 is positioned between the upper surface of the insulating layer 120 and a virtual plane which includes the lowermost portion of the trench 122 and is parallel to the upper surface of the insulating layer 120. It is to be noted that the lowermost portion of the trench 122 is the base portion 124. That is, at least part of the conductive plug 140 is positioned above the base portion 124 of the trench 122 and positioned below the upper surface of the insulating layer 120. In other words, at least part of the conductive plug 140 is positioned laterally of the trench 122.

In the present modification, the conductive plug 140 is positioned directly below a portion of the lower electrode 102, the portion being situated on the upper surface of the insulating layer 120. In other words, the conductive plug 140 overlaps with the lower electrode 102 in a plan view.

The conductive plug 140 is formed using, for instance, a conductive material such as metal. Specifically, the conductive plug 140 is formed using copper (Cu), tungsten (W) or the like. The conductive plug 140 is, for instance, part of a signal line or a power supply line included in the electronic device 11, or part of a conductive line which connects elements. The conductive plug 140 may be connected to the lower electrode 102 or the upper electrode 106 of the capacitor 100.

In the present modification, at least part of the conductive plug 140 is positioned laterally of the trench 122, thus the capacitor 100 can be electrostatically shielded from other capacitors or wires. Therefore, capacitive coupling caused by the capacitor 100 can be reduced, and the reliability of the operation of the electronic device 11 can be enhanced.

Second Embodiment

Figure 3:
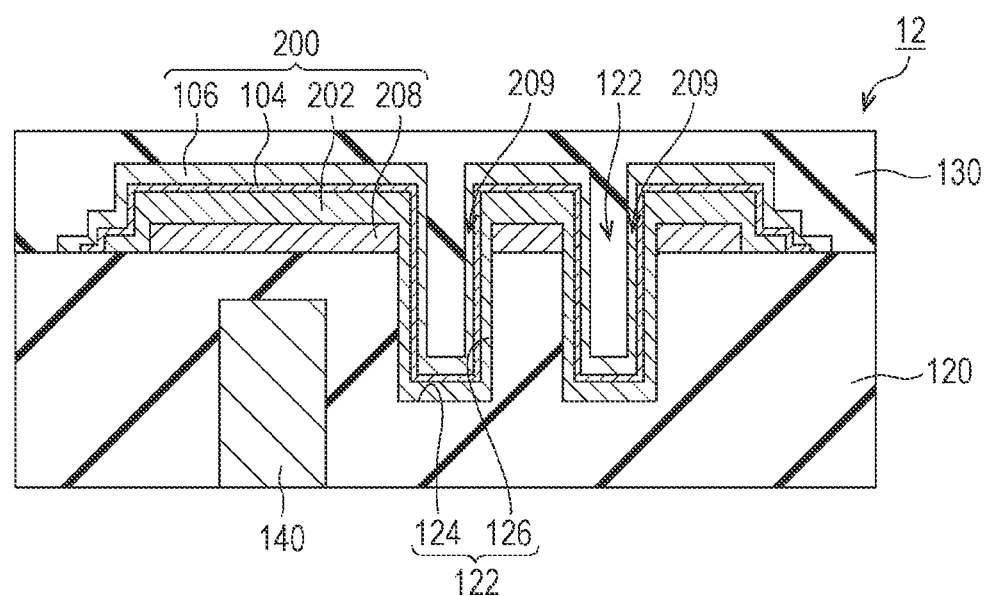
FIG. 3 is a cross-sectional view of a capacitor and its vicinity, the capacitor being included in an electronic device according to a second embodiment.

Next, a second embodiment will be described with reference to FIG. 3. FIG. 3 is a cross-sectional view of a capacitor 200 and its vicinity, the capacitor 200 being included in an electronic device 12 according to the present embodiment. It is to be noted that in the description of the present modification, a point of difference from the first embodiment and its modification will be mainly described, and a description of a common point is omitted or simplified.

As illustrated in FIG. 3, the capacitor 200 includes a first lower electrode 202, a second lower electrode 208, a dielectric layer 104, and an upper electrode 106.

Similarly to the lower electrode 102 according to the first embodiment, the first lower electrode 202 is provided along the inner walls of the trenches 122. In the present embodiment, the first lower electrode 202 continuously covers the inner walls of the trenches 122 and the second lower electrode 208. The first lower electrode 202 is the same as the lower electrode 102 according to the first embodiment except that the first lower electrode 202 covers the second lower electrode 208.

In the present embodiment, the first lower electrode 202 completely covers the second lower electrode 208. Specifically, the first lower electrode 202 is provided along not only the upper surface of the second lower electrode 208, but also the end faces of the second lower electrode 208 and the wall face of an opening 209 of the second lower electrode 208. For instance, the second lower electrode 208 is positioned inside of the first lower electrode 202 in a plan view. As illustrated in FIG. 3, each end of the first lower electrode 202 is positioned outside of a corresponding end of the second lower electrode 208, and is provided on the upper surface of the insulating layer 120.

The second lower electrode 208 is provided between the upper surface of the insulating layer 120 and the first lower electrode 202. Specifically, at least part of the second lower electrode 208 is provided directly above the conductive plug 140. The second lower electrode 208 is formed along the upper surface of the insulating layer 120 with a substantially uniform film thickness. Specifically, the second lower electrode 208 is a conductive film in a flat plate shape, and has the opening 209 as illustrated in FIG. 3.

The opening 209 is a through hole to open the upper portion of the trench 122. The opening 209 is provided in one-to-one correspondence to the trench 122. Specifically, the shape and size of the opening 209 is the same as the shape and size of the trench 122 in a plan view.

The second lower electrode 208 is formed using a material different from that of the first lower electrode 202. Specifically, the second lower electrode 208 is formed using a metal material such as tantalum (Ta) or tungsten (W), or metal nitride such as tantalum nitride or tungsten nitride (WN).

Subsequently, a method of manufacturing the electronic device 12 according to the present embodiment will be described with reference to FIG. 4A to FIG. 4M. Each of FIG. 4A to FIG. 4M is a cross-sectional view for illustrating a process in the method of manufacturing the electronic device 12.

Figure 4A:
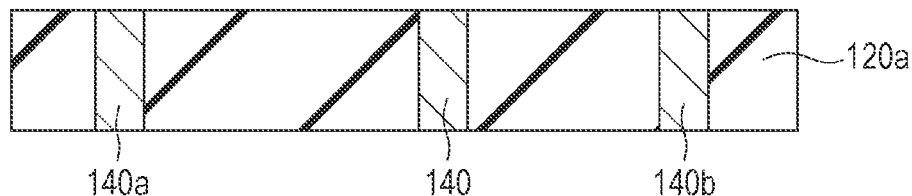
FIG. 4A is a cross-sectional view for illustrating a process of forming a conductive plug in an insulating film in a method of manufacturing the electronic device according to the second embodiment.

First, as illustrated in FIG. 4A, the conductive plug 140 is formed in a first insulating film 120a which is formed above a semiconductor substrate (not illustrated). Specifically, a contact hole is formed by patterning the first insulating film 120a composed of silicon oxide film, by photolithography and etching. A metal material such as copper (Cu) is formed in the contact hole by a vapor-deposition technique or a sputtering technique, thereby forming the conductive plug 140.

The conductive plug 140 is a contact plug to connect to the second lower electrode 208 of the capacitor 200, for instance. It is to be noted that in the example illustrated in FIG. 4A, in addition to the conductive plug 140, two conductive plugs 140a and 140b are formed at the same time. The conductive plug 140a is part of a contact plug to connect to a pixel electrode 214 of a photoelectric conversion element 210 (see FIG. 4M). The conductive plug 140b is a contact plug to connect to the upper electrode 106 of the capacitor 200. It is to be noted that at least one of the conductive plugs 140, 140a and 140b may not be provided.

Figure 4B:
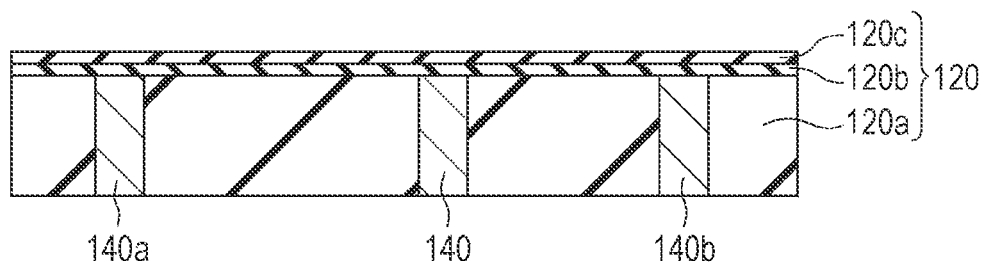
FIG. 4B is a cross-sectional view for illustrating a process of forming an insulating film which covers the conductive plug in the method of manufacturing the electronic device according to the second embodiment.

Next, as illustrated in FIG. 4B, a second insulating film 120b and a third insulating film 120c are sequentially formed on the entire surface by a plasma chemical vapor deposition (CVD) method. Specifically, the second insulating film 120b and the third insulating film 120c are sequentially formed so as to cover the upper surface of each of the conductive plugs 140, 140a and 140b, and the upper surface of the first insulating film 120a. The second insulating film 120b is, for instance, a silicon carbonitride film (SiCN film). The third insulating film 120c is, for instance, a silicon oxide film. A silicon carbonitride film can reduce the diffusion of metal contained in the conductive plugs 140, 140a and 140b.

The insulating layer 120 illustrated in FIG. 3 is formed by the first insulating film 120a, the second insulating film 120b and the third insulating film 120c. In short, in the present embodiment, the insulating layer 120 has a multi-layer structure in which multiple insulating layers are laminated. It is to be noted that the insulating layer 120 may be an insulating film in a single layer.

Figure 4C:
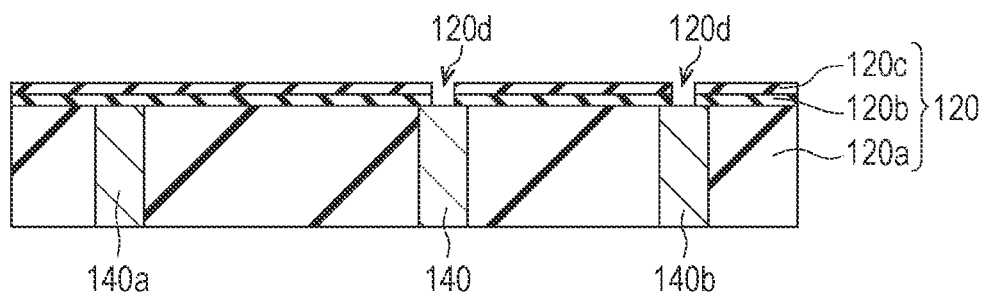
FIG. 4C is a cross-sectional view for illustrating a process of forming a contact hole for the conductive plug in the method of manufacturing the electronic device according to the second embodiment.

Next, as illustrated in FIG. 4C, an opening 120d penetrating the second insulating film 120b and the third insulating film 120c is formed by dry etching. The opening 120d is a through hole to expose the conductive plugs 140 and 140b.

Figure 4D:
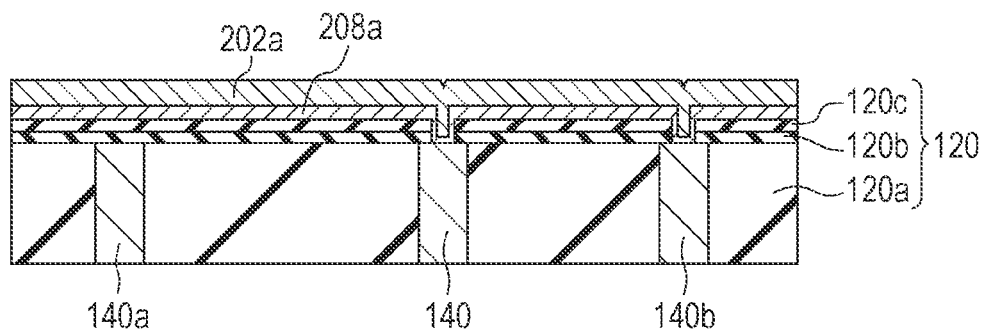
FIG. 4D is a cross-sectional view for illustrating a process of forming a conductive film for a second lower electrode and a conductive film for a metal mask in the method of manufacturing the electronic device according to the second embodiment.

Next, as illustrated in FIG. 4D, a first conductive film 208a and a second conductive film 202a are sequentially formed. The first conductive film 208a is, for instance, a tantalum nitride film. The second conductive film 202a is, for instance, a titanium nitride film. The first conductive film 208a corresponds to the second lower electrode 208. The second conductive film 202a corresponds to a lower layer portion of the first lower electrode 202.

The titanium nitride film can reduce the diffusion of the copper contained in the conductive plugs 140, 140a and 140b. The titanium nitride film serves as a metal mask to form the trench 122 in a later process. The tantalum nitride film and the titanium nitride film are each formed by a sputtering technique, a plasma CVD method or an atomic layer deposition (ALD) technique.

Figure 4E:
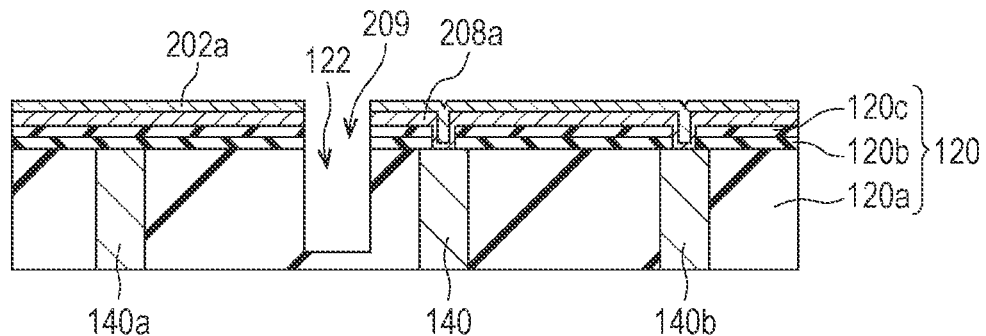
FIG. 4E is a cross-sectional view for illustrating a process of forming a trench in the method of manufacturing the electronic device according to the second embodiment.

Next, as illustrated in FIG. 4E, the trench 122 is formed. Specifically, after a resist mask is formed, the first conductive film 208a and the second conductive film 202a are patterned by dry etching using a chlorine ($Cl_2$) gas, for instance. Consequently, the opening 209 of the second lower electrode 208 is formed.

Subsequently, the resist mask is removed, and by use of the patterned second conductive film 202a as a mask, part of the third insulating film 120c, the second insulating film 120b and the first insulating film 120a is removed by dry etching using carbon tetrafluoride ($CF_4$) and an ethane ($C_2H_6$) gas.

At this point, the resist is removed by performing oxygen ashing treatment, for instance. When metal atoms are exposed to the surface at the time of oxygen ashing treatment, unusual oxidation of the metal atoms may occur. In the present embodiment, the diffusion of the metal atoms is reduced by the first conductive film 208a, thus the occurrence of unusual oxidation can also be reduced.

Figure 4F:
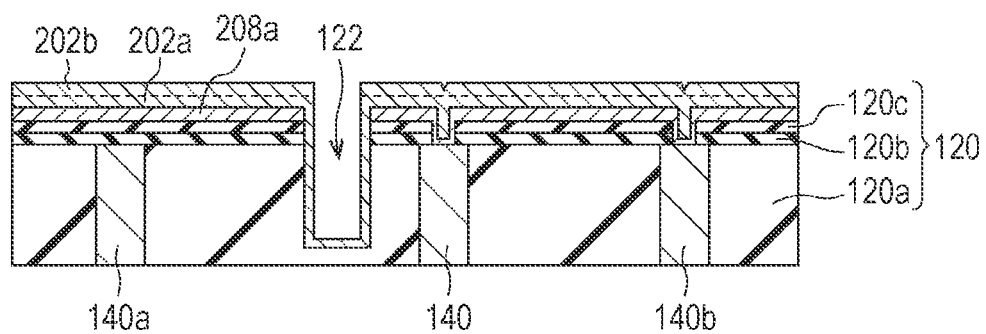
FIG. 4F is a cross-sectional view for illustrating a process of forming a conductive film for a first lower electrode in the method of manufacturing the electronic device according to the second embodiment.

Next, as illustrated in FIG. 4F, a third conductive film 202b is formed on the entire surface so as to cover the inner wall of the trench 122. The third conductive film 202b is, for instance, a titanium nitride film. The titanium nitride film is formed by a plasma CVD method or an ALD method, for instance.

In the present embodiment, the first lower electrode 202 is formed by the third conductive film 202b and the second conductive film 202a. Since the second conductive film 202a is not provided within the trench 122, the film thickness of the first lower electrode 202 is less than that of a flat portion in the trench 122.

Figure 4G:
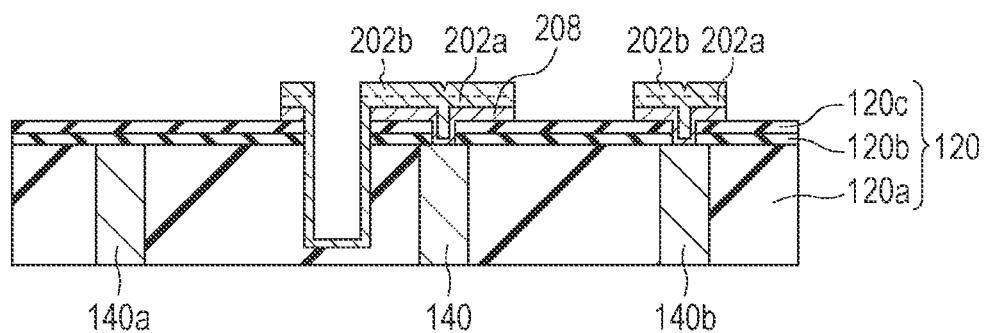
FIG. 4G is a cross-sectional view for illustrating a process of patterning the conductive film in the method of manufacturing the electronic device according to the second embodiment.

Next, as illustrated in FIG. 4G, the third conductive film 202b and the second conductive film 202a are patterned. Specifically, after a resist mask is formed, the third conductive film 202b and the second conductive film 202a are patterned by dry etching using a chlorine gas, for instance. Subsequently, the resist mask is removed.

Figure 4H:
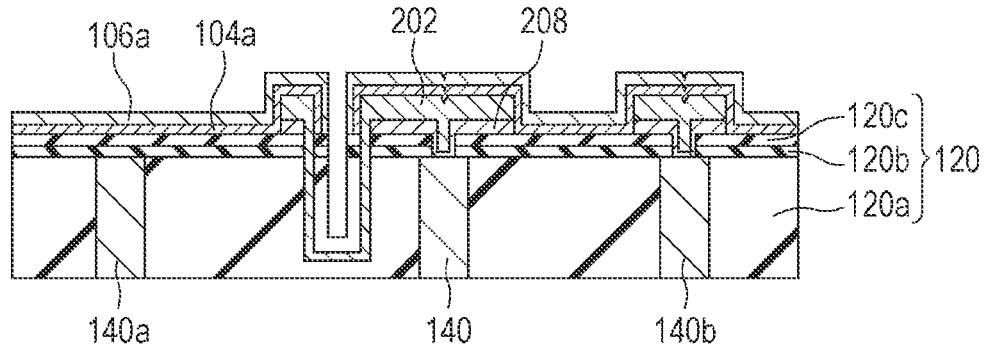
FIG. 4H is a cross-sectional view for illustrating a process of forming a dielectric film and a conductive film for the metal mask in the method of manufacturing the electronic device according to the second embodiment.

Next, as illustrated in FIG. 4H, a dielectric layer 104a and a fourth conductive film 106a are sequentially formed on the entire surface. The dielectric layer 104a is, for instance, a hafnium oxide film. The fourth conductive film 106a is, for instance, a titanium nitride film. The hafnium oxide film and the titanium nitride film are each formed by an ALD method or a plasma CVD method, for instance.

Figure 4I:
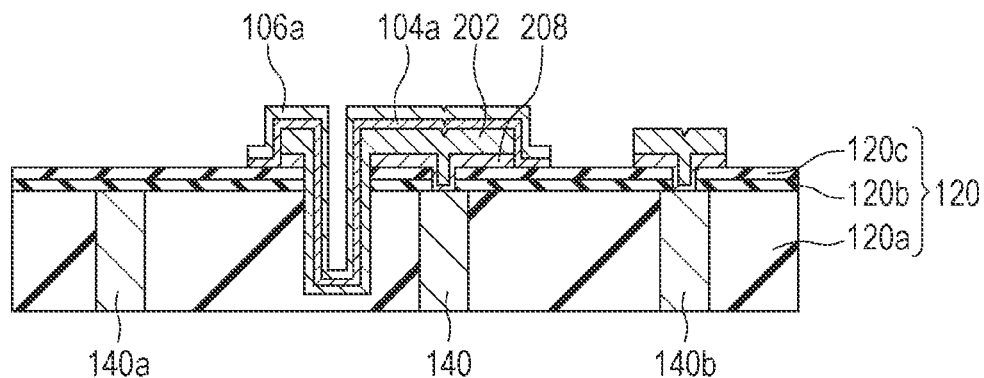
FIG. 4I is a cross-sectional view for illustrating a process of patterning the dielectric film and the conductive film in the method of manufacturing the electronic device according to the second embodiment.

Next, as illustrated in FIG. 4I, the fourth conductive film 106a and the dielectric layer 104a are patterned. Specifically, after a resist mask is formed, the fourth conductive film 106a and the dielectric layer 104a are patterned by dry etching using a chlorine gas, for instance. Subsequently, the resist mask is removed. The patterned dielectric layer 104a corresponds to the dielectric layer 104.

Figure 4J:
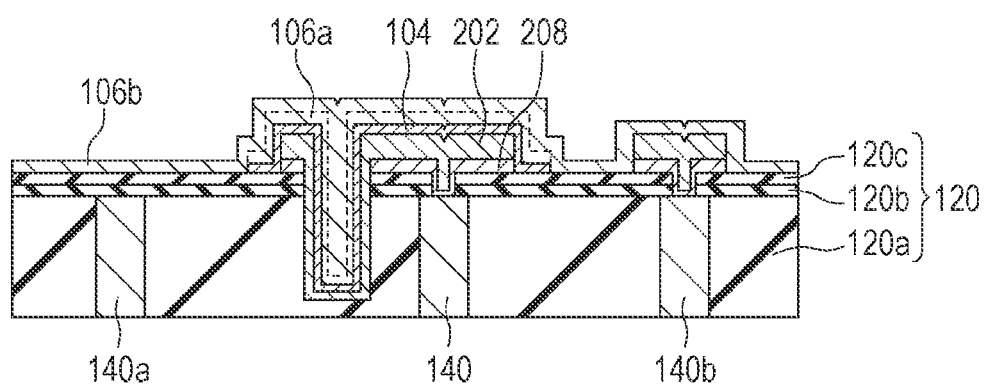
FIG. 4J is a cross-sectional view for illustrating a process of forming a conductive film for an upper electrode in the method of manufacturing the electronic device according to the second embodiment.

Next, as illustrated in FIG. 4J, a fifth conductive film 106b is formed on the entire surface. The fifth conductive film 106b is, for instance, a titanium nitride film. The titanium nitride film is formed by an ALD method or a plasma CVD method, for instance.

Figure 4K:
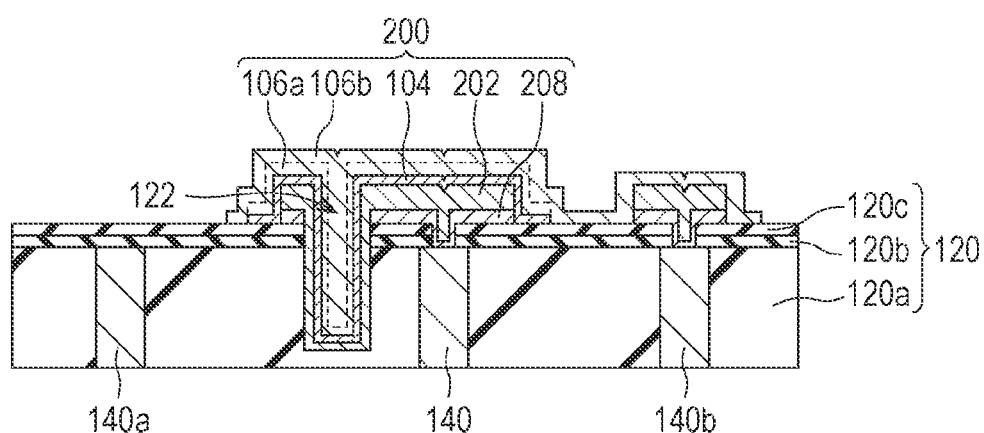
FIG. 4K is a cross-sectional view for illustrating a process of patterning the conductive film in the method of manufacturing the electronic device according to the second embodiment.

Next, as illustrated in FIG. 4K, the fifth conductive film 106b is patterned. Specifically, after a resist mask is formed, the fifth conductive film 106b is patterned by dry etching using a chlorine gas, for instance. Subsequently, the resist mask is removed.

The patterned fifth conductive film 106b and fourth conductive film 106a correspond to the upper electrode 106 of the capacitor 200. In the present embodiment, the fourth conductive film 106a and the fifth conductive film 106b are each a titanium nitride film, thus, the upper electrode 106 is substantially a titanium nitride film in a single layer.

In the present embodiment, the fifth conductive film 106b comes into contact with and covers the second conductive film 202a positioned directly above the conductive plug 140b. Specifically, the fifth conductive film 106b is continuous from the portion directly above the trench 122 and the conductive plug 140 to the portion directly above the conductive plug 140b. Thus, the upper electrode 106 of the capacitor 200 is electrically connected to the conductive plug 140b.

Through the processes above, the trench 122 is formed in the insulating layer 120, and the capacitor 200 is formed along the inner wall of the trench 122.

It is to be noted that as in the later-described third embodiment, there is a case where the electronic device 12 is an imaging device and a photoelectric conversion element is formed above the capacitor 200. In this case, subsequent to the formation process of the capacitor 200, a photoelectric conversion element is formed above the capacitor 200. Hereinafter, a method of forming a photoelectric conversion element 210 will be described with reference to FIG. 4L and FIG. 4M.

Figure 4L:
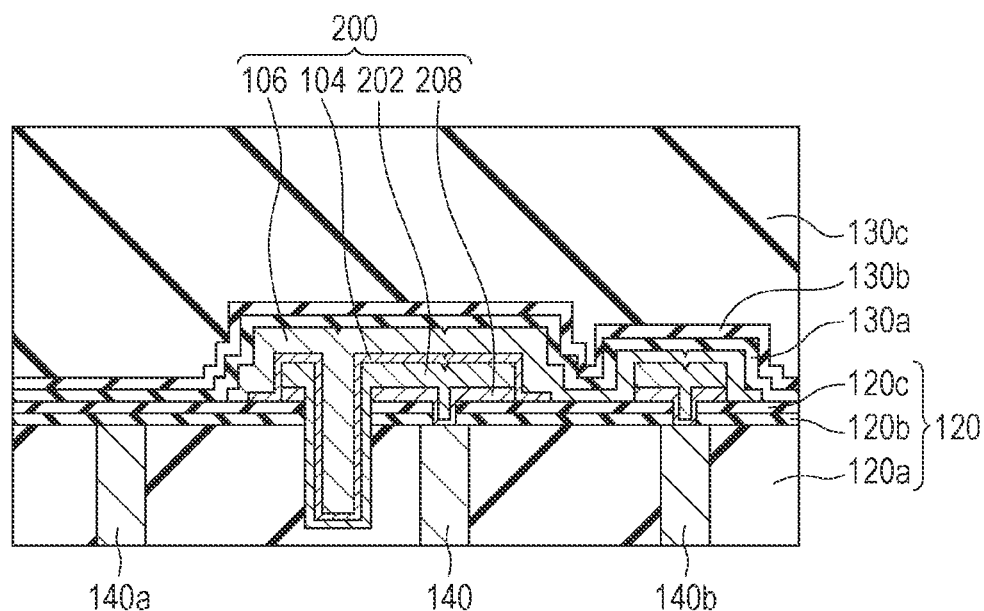
FIG. 4L is a cross-sectional view for illustrating a process of forming an insulating film which covers the capacitor in the method of manufacturing the electronic device according to the second embodiment.

First, as illustrated in FIG. 4L, a fourth insulating film 130a, a fifth insulating film 130b and a sixth insulating film 130c are sequentially formed so as to cover the capacitor 200. The fourth insulating film 130a is, for instance, a silicon carbonitride film. The fifth insulating film 130b is, for instance, a silicon nitride film. The sixth insulating film 130c is, for instance, a silicon oxide film. Each insulating film is formed by a plasma CVD method, for instance. After the film formation, the surface of the sixth insulating film 130c is planarized by chemical mechanical polishing (CMP). The insulating layer 130 illustrated in FIG. 3 is formed by the fourth insulating film 130a, the fifth insulating film 130b and the sixth insulating film 130c.

Figure 4M:
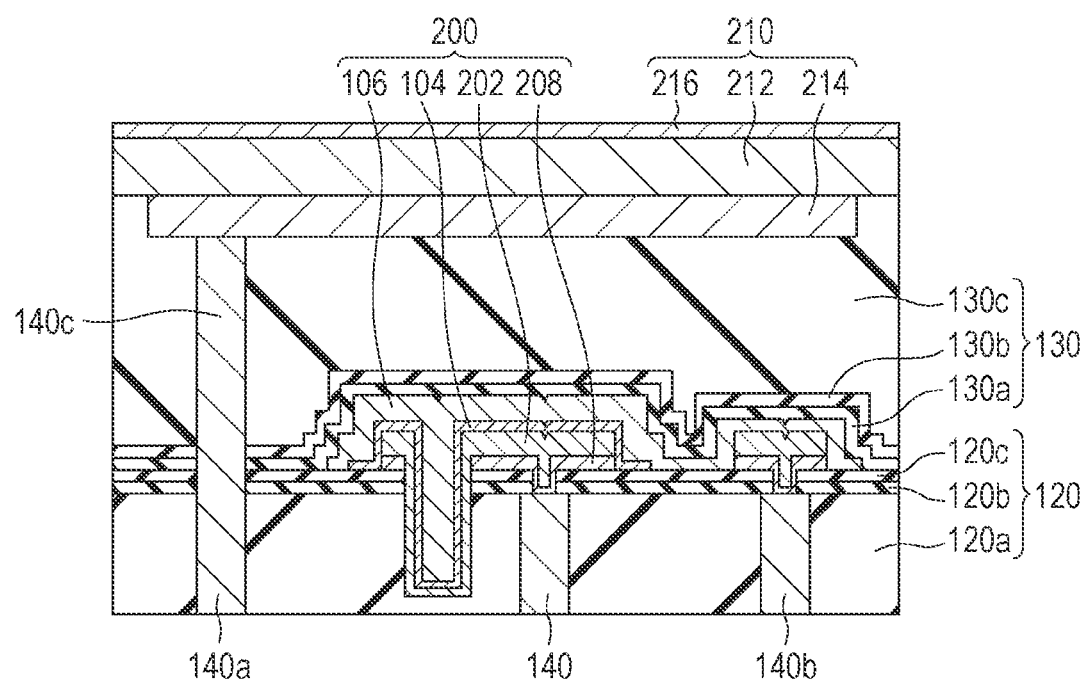
FIG. 4M is a cross-sectional view for illustrating a process of forming a photoelectric conversion element in the method of manufacturing the electronic device according to the second embodiment.

Next, as illustrated in FIG. 4M, a conductive plug 140c, a pixel electrode 214, an organic photoelectric conversion film 212, and a transparent electrode 216 are sequentially formed. Specifically, a contact hole to expose the conductive plug 140a is formed, and a metal material such as copper (Cu) is formed in the contact hole by a vapor-deposition technique or a sputtering technique, thereby forming the conductive plug 140c.

In addition, for instance, a titanium nitride film is formed, and patterned, thereby forming the pixel electrode 214. Formation of a titanium nitride film is performed by a sputtering technique or a plasma CVD method, for instance. The patterning is performed by dry etching using a chlorine gas. It is to be noted that the pixel electrode 214 is patterned, for instance, in an island shape for each pixel included in the imaging device.

Furthermore, an organic photoelectric conversion material is coated and cured on the entire surface so as to cover the pixel electrode 214, thereby forming the organic photoelectric conversion film 212. On the upper surface of the formed organic photoelectric conversion film 212, for instance, a transparent conductive film such as indium tin oxide (ITO) is formed as the transparent electrode 216. Formation of the transparent conductive film is performed by sputtering, for instance.

Through the processes above, for instance, the electronic device 12 such as an imaging device is formed.

As described above, in the present embodiment, the second lower electrode 208 is positioned directly above the conductive plug 140, thus diffusion of metal atoms contained in the conductive plug 140 followed by exposure of the metal atoms to the surface can be reduced. Because diffusion of the metal atoms is reduced, the occurrence of a failure in a process of forming the capacitor 200 and reliability degradation of the operation of the electronic device 12 can be reduced.

Third Embodiment

Next, an imaging device according to a third embodiment will be described with reference to FIG. 5 and FIG. 6.

Figure 5:
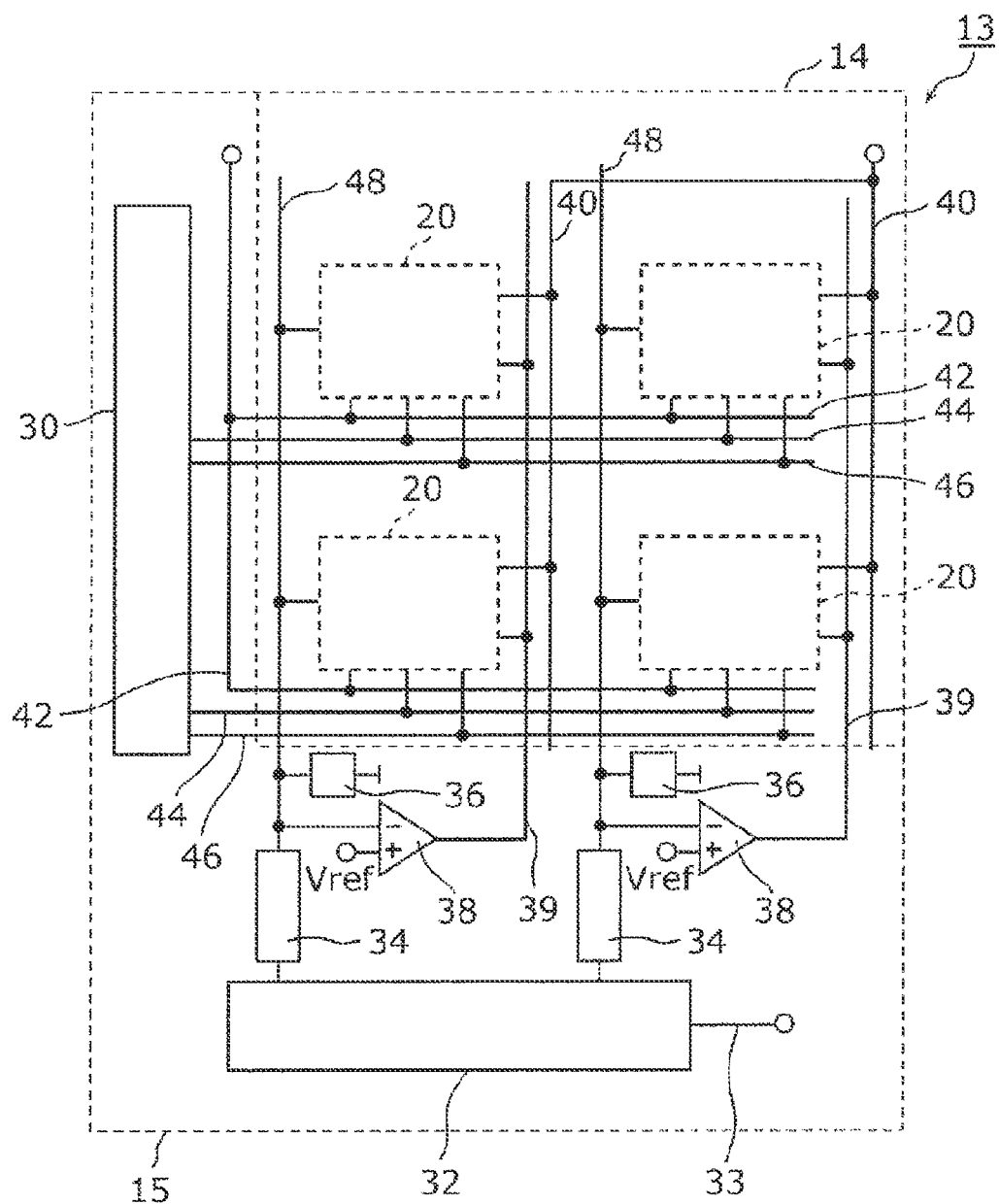
FIG. 5 is a diagram illustrating the configuration of an imaging device according to a third embodiment.

FIG. 5 is a diagram illustrating the configuration of an imaging device 13 according to the present embodiment. FIG. 6 schematically illustrates a planar layout when the imaging device 13 is viewed from the light incident side. The imaging device 13 is an example of the electronic device including the capacitor 100 or 200. For instance, the imaging device 13 is a surface irradiation complementary metal oxide semiconductor (CMOS) image sensor.

As illustrated in FIG. 5, the imaging device 13 includes a pixel region 14, and a peripheral circuit region 15. The peripheral circuit region 15 is a region situated in the periphery of the pixel region 14 when the pixel region 14 is viewed in a plan view.

In the pixel region 14, multiple pixels 20 are arranged. The multiple pixels 20 are arranged side by side in a matrix form within the surface. However, this is not always the case. For instance, the multiple pixels 20 may be arranged side by side in a column.

Each of the multiple pixels 20 is connected to multiple power supply lines and multiple signal lines. Specifically, as illustrated in FIG. 5, the imaging device 13 includes multiple first power supply lines 40, multiple second power supply lines 42, multiple reset signal lines 44, multiple selection signal lines 46, and multiple vertical signal lines 48.

In the example illustrated in FIG. 5, the first power supply lines 40 and the vertical signal lines 48 are each provided for every multiple columns of pixels 20. For instance, each first power supply line 40 is connected to multiple pixels 20 side by side in a column out of the multiple pixels 20 arranged in the pixel region 14. The same goes with the vertical signal lines 48.

The second power supply line 42, the reset signal line 44 and the selection signal line 46 are each provided for every multiple rows of pixels 20. For instance, each second power supply lines 42 is connected to multiple pixels 20 side by side in a row out of the multiple pixels 20 arranged in the pixel region 14. The same goes with the reset signal line 44 and the selection signal line 46.

In this manner, in the present embodiment, each power supply line and each signal line are examples of the first signal line and the second signal line which are connected to two or more of the multiple pixels 20, and extend outwardly of the pixel region 14. The detailed configuration of the pixels 20, and the relationship of connection between each of the power supply lines and the signal lines, and the elements in the pixels 20 will be described later.

The peripheral circuit region 15 is provided with one or more peripheral circuits which drive each of the multiple pixels 20. Specifically, as illustrated in FIG. 5, the imaging device 13 includes a vertical scanning circuit 30, a horizontal scanning circuit 32, column signal processing circuits 34, load circuits 36, and inverting amplifiers 38 as one or more peripheral circuits. The column signal processing circuits 34, the load circuits 36, and the inverting amplifiers 38 are each provided for every multiple columns of pixels 20, that is, for every vertical signal line 48.

The vertical scanning circuit 30 controls the potential supplied to a signal line for selecting a pixel 20 from which a signal charge is to be read. Specifically, the vertical scanning circuit 30 controls the potential supplied to the reset signal lines 44 and the selection signal lines 46.

The horizontal scanning circuit 32 processes a signal charge transferred from each pixel 20 via a vertical signal line 48 provided for every column. The horizontal scanning circuit 32 is connected to an output signal line 33, and sequentially outputs a signal charge transferred from each of the multiple pixels 20. Specifically, the horizontal scanning circuit 32 sequentially outputs a signal charge from the output signal line 33, the signal charge having been transferred from each pixel 20 and processed by a corresponding column signal processing circuit 34.

Each column signal processing circuit 34 is connected between the pixels 20 connected to a corresponding vertical signal line 48 and the horizontal scanning circuit 32. The column signal processing circuit 34 performs noise processing represented by correlated double sampling, and analog-digital conversion (AD conversion).

Each load circuit 36 forms a source follower circuit along with an amplifying transistor 24 (see FIG. 6) included in a pixel 20. The load circuit 36 serves as a constant current source.

Each inverting amplifier 38 forms a feedback circuit that supplies a reset voltage for resetting the electric charge storages of pixels 20. Specifically, the inverting amplifier 38 includes an inverting input terminal connected to a vertical signal line 48, a non-inverting input terminal to which a predetermined reference voltage Vref is supplied, and an output terminal connected to a feedback line 39. As illustrated in FIG. 6, the feedback line 39 is connected to a reset transistor 22 of each of the multiple pixels 20 connected to the vertical signal line 48 to which the inverting input terminal is connected.

Subsequently, the configuration of each pixel 20 of the imaging device 13 will be described with reference to FIG. 6 and FIG. 7. FIG. 6 is a circuit diagram illustrating the circuit configuration of the pixel 20 of the imaging device 13 according to the present embodiment. FIG. 7 is a cross-sectional view of the pixel 20 of the imaging device 13 according to the present embodiment. In the present embodiment, the circuit configurations and the cross-sectional configurations of the multiple pixels 20 are equivalent to each other. Hereinafter, first, the circuit configuration of the pixel 20 will be described with reference to FIG. 6.

Figure 6:
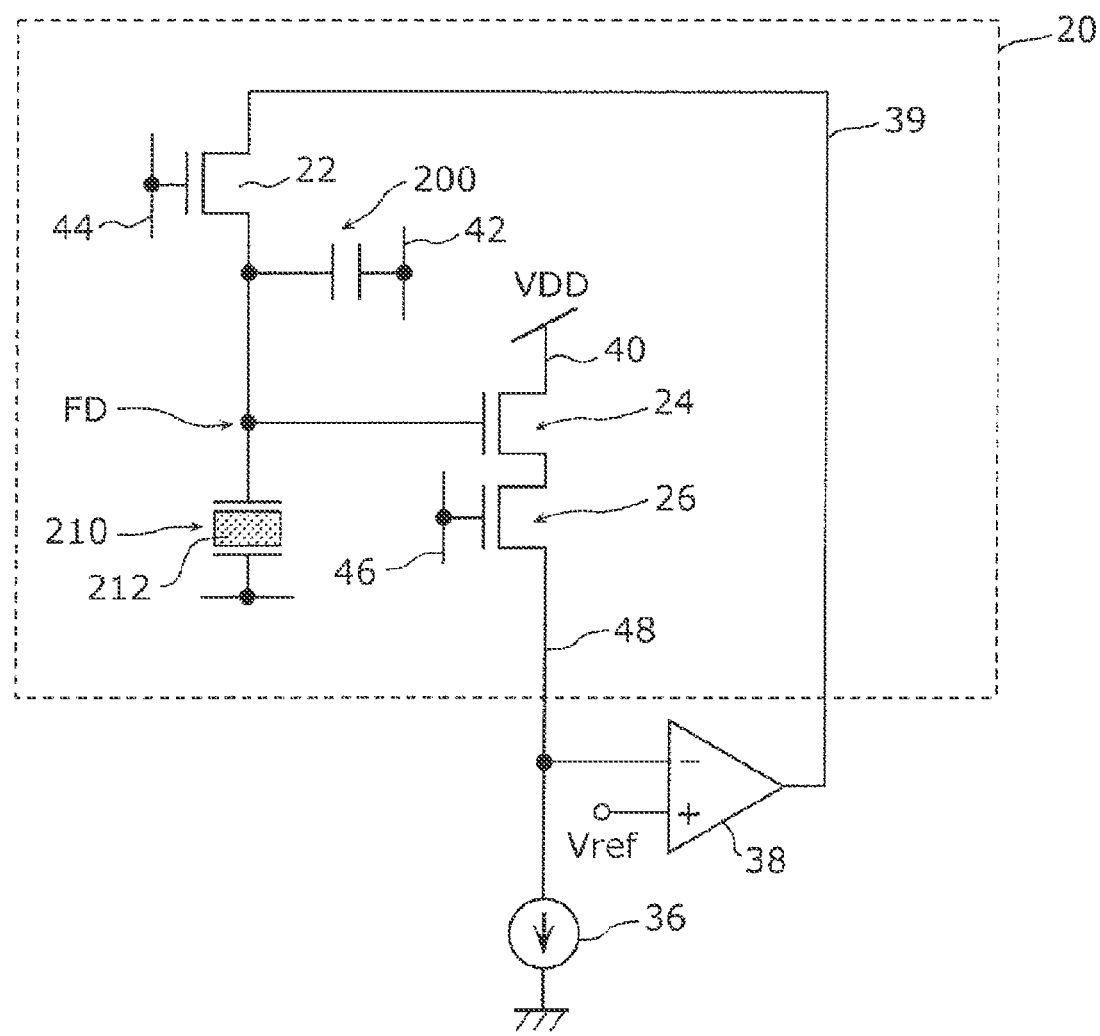
FIG. 6 is a circuit diagram illustrating the circuit configuration of a pixel of the imaging device according to the third embodiment.
Figure 7:
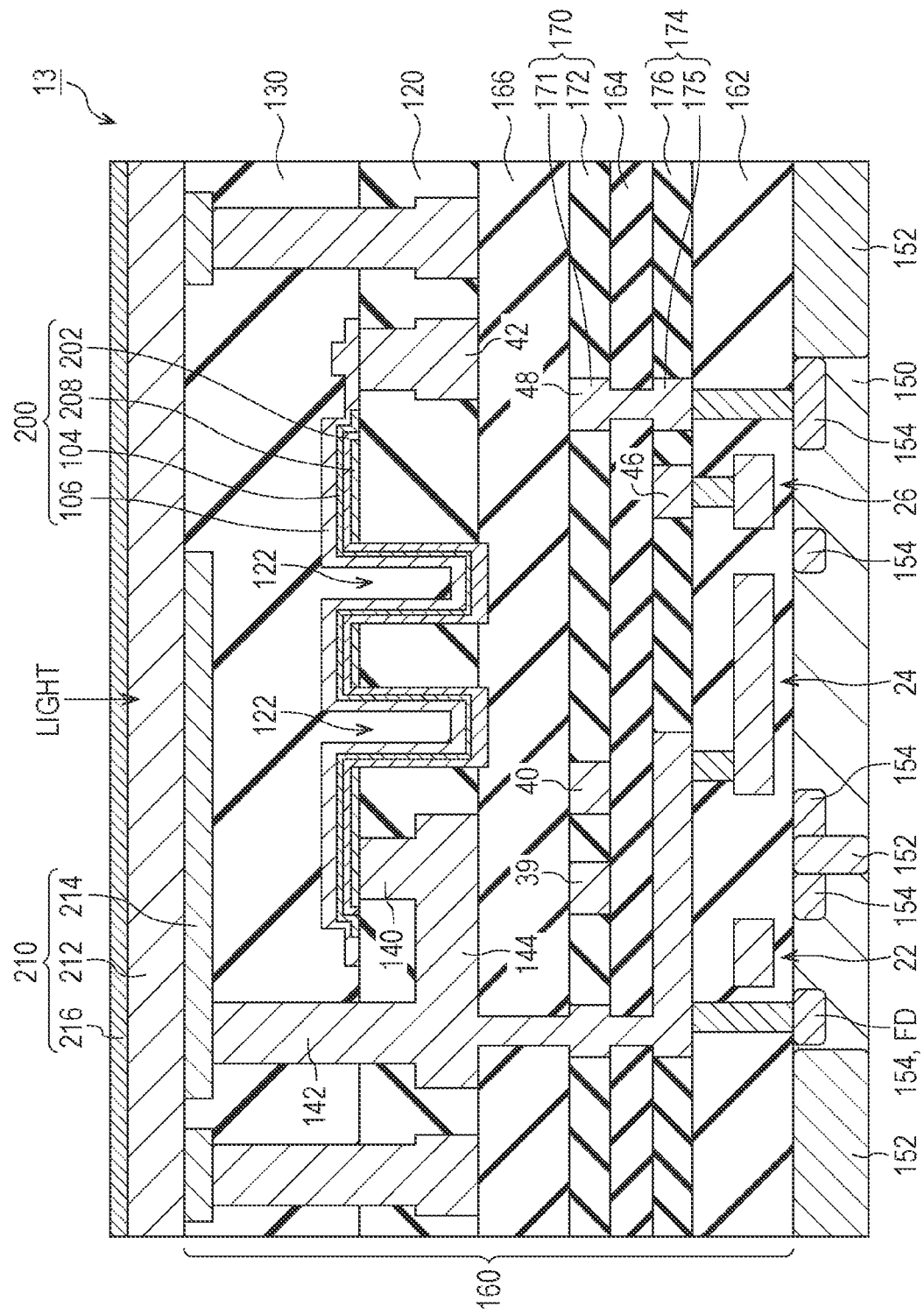
FIG. 7 is a cross-sectional view of a pixel of the imaging device according to the third embodiment.

As illustrated in FIG. 6, the pixel 20 has a capacitor 200, a photoelectric conversion element 210, a reset transistor 22, an amplifying transistor 24, and a selection transistor 26.

The capacitor 200 is provided to store the signal charge generated by the photoelectric conversion element 210. Since the signal charge generated by the photoelectric conversion element 210 is stored in the capacitor 200, the saturation level of the photoelectric conversion element 210 can be increased. Therefore, the dynamic range of the pixel 20 can be increased.

The capacitor 200 is, for instance, the capacitor 200 according to the second embodiment illustrated in FIG. 3. It is to be noted that the imaging device 13 may include the capacitor 100 illustrated in FIG. 1 or FIG. 2 instead of the capacitor 200.

One of two electrodes included in the capacitor 200 is connected to the photoelectric conversion element 210. The other of the two electrodes included in the capacitor 200 is connected to a second power supply line 42. For instance, the first lower electrode 202 of the capacitor 200 is connected to the photoelectric conversion element 210, and the upper electrode 106 is connected to the second power supply line 42.

The photoelectric conversion element 210 generates an electric charge according to incident light. For instance, the photoelectric conversion element 210 is an organic photoelectric conversion element that includes the organic photoelectric conversion film 212, and two electrodes by which the organic photoelectric conversion film 212 is interposed.

The organic photoelectric conversion film 212 is an example of a photoelectric converter that generates an electric charge according to incident light. When light is incident to the organic photoelectric conversion film 212, a pair of an electron and a positive hole is generated. In the present embodiment, one of the generated pair of an electron and a positive hole is stored in the capacitor 200 as a signal charge. A specific configuration of the photoelectric conversion element 210 will be described later with reference to FIG. 7.

A diffusion region (floating diffusion) FD to store an electric charge is provided between the photoelectric conversion element 210 and the capacitor 200. For instance, as illustrated in FIG. 7, the diffusion region FD is formed within a semiconductor substrate 150. The diffusion region FD, one electrode of the capacitor 200 connected to the diffusion region FD, and one electrode of the photoelectric conversion element 210 correspond to an electric charge storage that stores a signal charge.

The reset transistor 22 is a switching device to switch between conduction and non-conduction between the diffusion region FD and the feedback line 39. The reset transistor 22 is provided to reset the electric charge in the diffusion region FD. One of the drain and the source of the reset transistor 22 is connected to the feedback line 39, and the other of the drain and the source is connected to the diffusion region FD.

The amplifying transistor 24 forms a source follower circuit along with the load circuit 36 which serves as a constant current source. Specifically, the amplifying transistor 24 converts the potential of the gate to a voltage, and outputs the voltage to the vertical signal line 48. One of the drain and the source of the amplifying transistor 24 is connected to the first power supply line 40, and the other of the drain and the source is connected to the vertical signal line 48. It is to be noted that in the present embodiment, the other of the drain and the source of the amplifying transistor 24 is connected to the vertical signal line 48 via the selection transistor 26. The gate of the amplifying transistor 24 is connected to the diffusion region FD.

The selection transistor 26 is a switching device to switch between conduction and non-conduction between the amplifying transistor 24 and the vertical signal line 48. One of the drain and the source of the selection transistor 26 is connected to the other of the drain and the source of the amplifying transistor 24. The other of the drain and the source of the selection transistor 26 is connected to the vertical signal line 48. The gate of the selection transistor 26 is connected to the selection signal line 46.

In the present embodiment, the reset transistor 22, the amplifying transistor 24 and the selection transistor 26 are each a metal oxide semiconductor field effect transistor (MOSFET). Alternatively, each transistor may be a thin film transistor (TFT).

For instance, each transistor is an n-type MOS transistor. When the potential supplied to the gate of a transistor is at a high level, the transistor is turned on, that is, is in a conductive state. When the potential supplied to the gate is at a low level, the transistor is turned off, that is, is in a non-conductive state. It is to be noted that each transistor may be a p-type MOS transistor. In this case, the relationship between the level of a voltage supplied to the gate of each transistor and ON/OFF of each transistor is reversed as compared with the case of an n-type MOS transistor. It is to be noted that in the transistors, n-type MOS transistors and p-type MOS transistors may be mixed.

Here, the processing to read a signal charge from the pixel 20 will be described.

First, a reset operation is performed, which is processing to reset the electric charges stored in the electric charge storage including the diffusion region FD. Specifically, the vertical scanning circuit 30 supplies a high level potential to each of the reset signal lines 44 and the selection signal lines 46, thereby setting each of the reset transistor 22 and the selection transistor 26 in a conductive state. Consequently, a feedback circuit via the feedback line 39 is formed.

Formation of a feedback circuit causes the voltage of the vertical signal line 48 to be restrained to the input voltage Vref of the inverting amplifier 38 to the non-inverting input terminal. In other words, the voltage of the diffusion region FD is reset so that the voltage of the vertical signal line 48 is Vref. Thus, the effect of kTC noise caused by ON and OFF of the reset transistor 22 can be reduced. The magnitude of Vref is, for instance, within the range between a power supply voltage VDD and the ground voltage. The magnitude of the power supply voltage VDD is, for instance, 3.3 V, however, this is not always the case.

After the reset operation, the vertical scanning circuit 30 supplies a low level potential to each of the reset signal lines 44 and the selection signal lines 46, thereby setting each of the reset transistor 22 and the selection transistor 26 in a non-conductive state. Subsequently, the photoelectric conversion element 210 is exposed to light. The signal charge generated by the photoelectric conversion element 210 due to light exposure is stored in the diffusion region FD and the capacitor 200.

At a predetermined timing after the light exposure, the vertical scanning circuit 30 supplies a high level potential to the selection signal line 46, thereby setting the selection transistor 26 in a conductive state. The gate of the amplifying transistor 24 is connected to the electric charge storage including the diffusion region FD and the capacitor 200. Thus, the potential of the gate changes according to the electric charge stored in the electric charge storage, and a voltage signal according to the change of the potential is outputted to the vertical signal line 48. The signal outputted to the vertical signal line 48 is processed by the column signal processing circuit 34 and the horizontal scanning circuit 32, and is read from the output signal line 33 as a pixel signal.

Similar processing is performed on each of the multiple pixels 20, thus a signal charge generated by each pixel 20 is read, and image data is generated.

Subsequently, the cross-sectional configuration of the pixel 20 of the imaging device 13 according to the present embodiment will be described with reference to FIG. 7.

As illustrated in FIG. 7, the imaging device 13 includes a semiconductor substrate 150, and a multi-layer wiring layer 160. The reset transistor 22, the amplifying transistor 24 and the selection transistor 26 included in the pixel 20 are provided in the surface vicinity of the semiconductor substrate 150. The capacitor 200 is provided inside of the multi-layer wiring layer 160. The photoelectric conversion element 210 is provided above the multi-layer wiring layer 160.

The semiconductor substrate 150 is a substrate formed of a semiconductor material such as silicon, for instance. As illustrated in FIG. 7, the semiconductor substrate 150 is provided with a separation region 152 and an impurity region 154. The separation region 152 and the impurity region 154 are formed by implanting impurities by ion implantation, for instance.

The separation region 152 is a region for separating elements included in the pixel 20. In the example illustrated in FIG. 7, the separation region 152 is provided to separate adjacent pixels 20, and the reset transistor 22 from the amplifying transistor 24 within each pixel 20. For instance, when each transistor is an n-type transistor, the separation region 152 is formed by implanting ions, such as boron (B), into the semiconductor substrate 150. For instance, when each transistor is a p-type transistor, the separation region 152 is formed by implanting ions, such as phosphorus (P) or arsenic (As), into the semiconductor substrate 150. Alternatively, the separation region 152 may have a shallow trench isolation (STI) structure into which an oxide film is buried.

The impurity region 154 is the source or drain of each transistor. As illustrated in FIG. 7, multiple impurity regions 154 are provided on the surface vicinity of the semiconductor substrate 150. Each of the multiple impurity regions 154 is formed by implanting ions, such as phosphorus (P) or arsenic (As), into the semiconductor substrate 150. For instance, the impurity regions 154 are each an n-type semiconductor region, however, may be a p-type semiconductor region.

In the present embodiment, the diffusion region FD is provided as one of the impurity regions 154. The diffusion region FD corresponds the source or the drain of the reset transistor 22.

The multi-layer wiring layer 160 is provided above the semiconductor substrate 150. As illustrated in FIG. 7, the multi-layer wiring layer 160 has multiple insulating layers 120, 130, 162, 164 and 166, and multiple wiring layers 170 and 174. Specifically, the insulating layer 162, the wiring layer 174, the insulating layer 164, the wiring layer 170, the insulating layer 166, the insulating layer 120 and the insulating layer 130 are provided in that order on the upper surface of the semiconductor substrate 150.

The insulating layers 162, 164 and 166 are each an interlayer insulating layer provided between wiring layers. The insulating layers 162, 164 and 166 are each formed of, for instance, a silicon oxide film or a silicon nitride film. The film thickness of each of the insulating layers 162, 164 and 166 is greater than the film thickness of each of the wiring layer 170 and the wiring layer 174, for instance.

The wiring layer 170 is an example of the first wiring layer provided between the upper surface of the insulating layer 120 including the trench 122 and the semiconductor substrate 150. Specifically, the wiring layer 170 is provided between the lowermost portion of the trench 122 and the semiconductor substrate 150. In other words, the wiring layer 170 is provided between a virtual plane including the lowermost portion of the trench 122 and the semiconductor substrate 150. In the present embodiment, the wiring layer 170 is a layer positioned between the insulating layer 164 and the insulating layer 166, and includes a conductive line 171 which forms a signal line or a power supply line, and an insulating layer 172 positioned laterally of the conductive line 171.

The wiring layer 174 is an example of the second wiring layer which is provided between the wiring layer 170 and the semiconductor substrate 150. The wiring layer 174 is positioned below the wiring layer 170. The wiring layer 174 is a layer positioned between the insulating layer 164 and the insulating layer 162, and includes a conductive line 175 which forms a signal line or a power supply line, and an insulating layer 176 positioned laterally of the conductive line 175.

It is to be noted that the wiring layer 174 may be positioned above the wiring layer 170. The upper or lower relationship between the wiring layers included in the multi-layer wiring layer 160 is not particularly restricted.

The signal lines and the power supply lines provided over the multiple pixels 20 are included in one or more wiring layers included in the multi-layer wiring layer 160. In the example illustrated in FIG. 7, the first power supply line 40, the vertical signal line 48, and the feedback line 39 are each an example of the first signal line, and included in the wiring layer 170. The selection signal line 46 is an example of the second signal line, and is included in the wiring layer 174. The second power supply line 42 is included in a lower layer portion of the insulating layer 120. Although not illustrated in FIG. 7, the reset signal line 44 is included in the wiring layer 170 or the wiring layer 174, for instance. It is to be noted that the position where each signal line of each power supply line is provided in the multi-layer wiring layer 160 is not particularly restricted.

In the present embodiment, the photoelectric conversion element 210 is positioned above the capacitor 200. As illustrated in FIG. 7, the photoelectric conversion element 210 includes the organic photoelectric conversion film 212, the pixel electrode 214, and the transparent electrode 216.

The organic photoelectric conversion film 212 is provided continuously over multiple pixels 20, for instance. For instance, the organic photoelectric conversion film 212 is provided on the entire surface above the multi-layer wiring layer 160.

The pixel electrode 214 is an electrode for transferring a signal charge generated by the organic photoelectric conversion film 212. The pixel electrode 214 is connected to the pixel electrode 214. The pixel electrode 214 is provided for every pixel 20. As illustrated in FIG. 7, the pixel electrode 214 is provided on the uppermost surface of the multi-layer wiring layer 160. The pixel electrode 214 is formed using a metal material such as copper or a metal nitride such as titanium nitride, for instance.

The transparent electrode 216 is provided above the surface of the organic photoelectric conversion film 212. The transparent electrode 216 is an electrode to collect the other of a pair of an electron and a positive hole, generated by the organic photoelectric conversion film 212. The transparent electrode 216 is in contact with and provided on the entire surface of the organic photoelectric conversion film 212, for instance. The transparent electrode 216 is formed using a material, such as ITO having translucency and conductivity.

As illustrated in FIG. 7, the imaging device 13 according to the present embodiment includes the conductive plug 142 is an example of the second conductive plug which is positioned directly below the pixel electrode 214 and connected to the pixel electrode 214. A conductive layer 144 is connected to the conductive plug 142 and the conductive plug 140.

In the present embodiment, the first lower electrode 202 and the second lower electrode 208 of the capacitor 200 are connected to the pixel electrode 214 and the diffusion region FD via the conductive plug 140, the conductive layer 144 and the conductive plug 142. The first lower electrode 202, the second lower electrode 208, the conductive plug 140, the conductive layer 144, the conductive plug 142, the pixel electrode 214 and the diffusion region FD form the electric charge storage.

As illustrated in FIG. 7, the conductive layer 144 is positioned between the uppermost portion of trench 122 and the upper surface of the insulating layer 120. In other words, the conductive layer 144 is positioned between a virtual plane which includes the lowermost portion of the trench 122 and the upper surface of the insulating layer 120. In short, the conductive layer 144 is positioned laterally of the trench 122. Thus, the lateral space of the trench 122 can be effectively utilized, and an increase in the thickness of the imaging device 13 is reduced.

As described above, in the imaging device 13 according to the present embodiment, the capacitor 200 stores an electric charge generated by the photoelectric conversion element 210, thus the saturation level of the photoelectric conversion element 210 can be increased. Therefore, the dynamic range of the imaging device 13 can be increased.

First Modification

Figure 8:
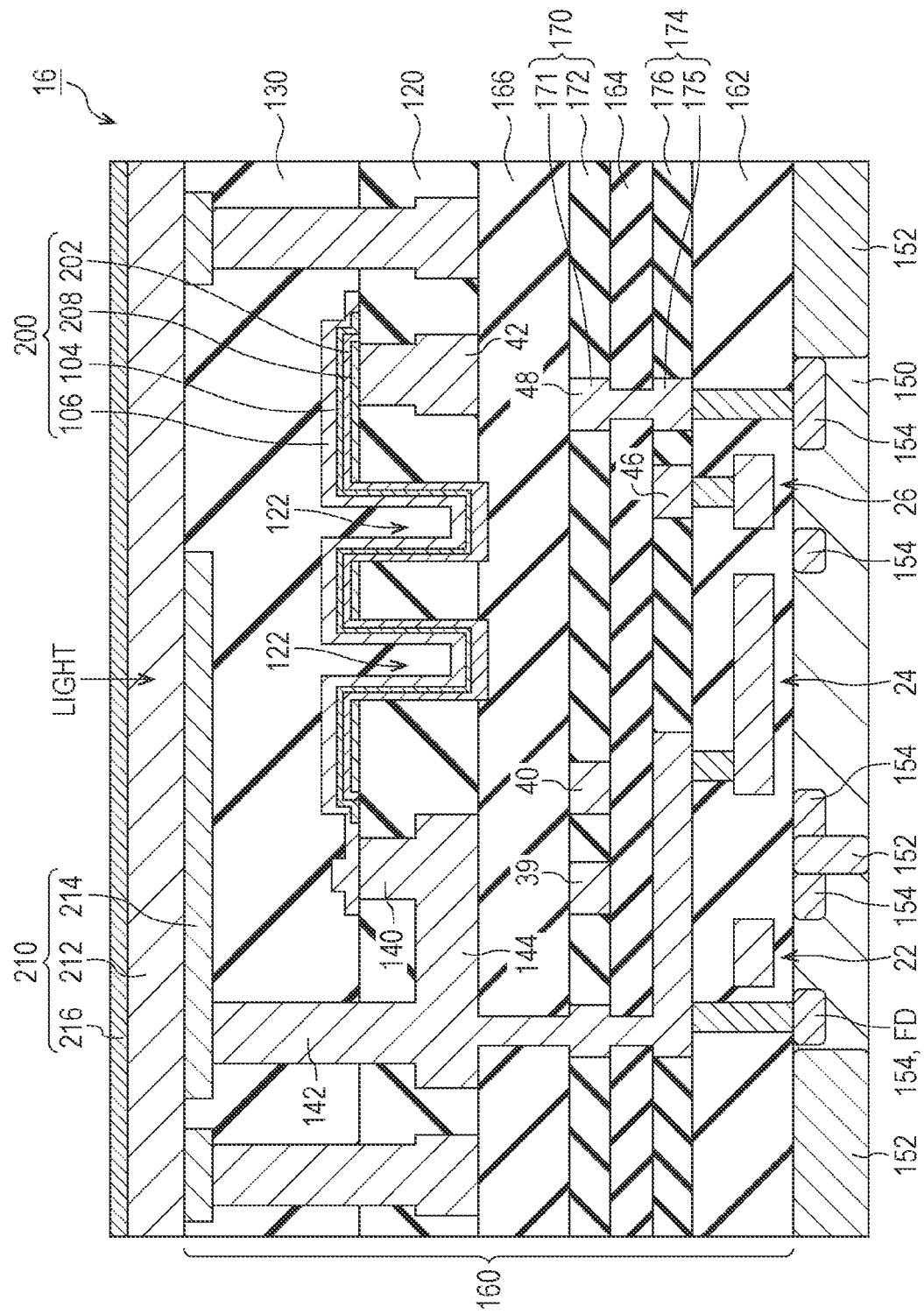
FIG. 8 is a cross-sectional view of a pixel of an imaging device according to a first modification of the third embodiment.

Subsequently, a first modification of the third embodiment will be described with reference to FIG. 8. FIG. 8 is a cross-sectional view of a pixel 20 of an imaging device 16 according to the present modification. In the description of the present modification, a point of difference from the third embodiment will be mainly described, and a description of a common point is omitted or simplified.

As illustrated in FIG. 8, in the imaging device 16 according to the present modification, the conductive plug 140 is connected to the upper electrode 106 of the capacitor 200. That is, the pixel electrode 214 of the photoelectric conversion element 210 and the upper electrode 106 are connected via the conductive plug 142, the conductive layer 144 and the conductive plug 140. In the present modification, the upper electrode 106 of the capacitor 200 constitutes part of the electric charge storage. The first lower electrode 202 and the second lower electrode 208 are connected to the second power supply line 42.

Similarly to the third embodiment, also in the present modification, the signal charge generated by the photoelectric conversion element 210 is stored in the capacitor 200, thus the saturation level of the photoelectric conversion element 210 can be increased. Therefore, the dynamic range of the imaging device 16 can be increased.

Second Modification

Figure 9:
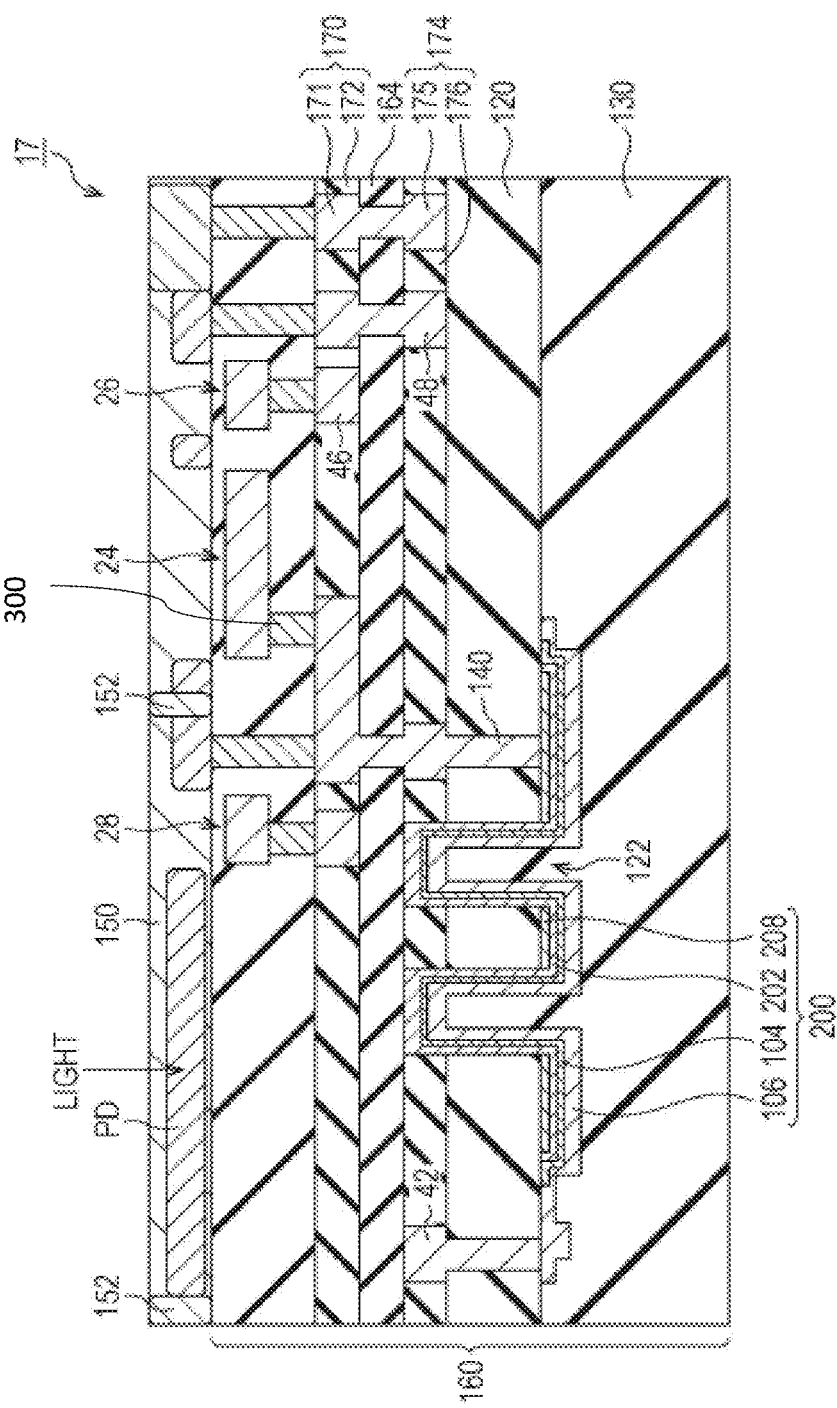
FIG. 9 is a cross-sectional view of a pixel of an imaging device according to a second modification of the third embodiment.

Subsequently, a second modification of the third embodiment will be described with reference to FIG. 9. FIG. 9 is a cross-sectional view of a pixel 20 of an imaging device 17 according to the present modification. In the description of the present modification, a point of difference from the third embodiment will be mainly described, and a description of a common point is omitted or simplified.

The imaging device 17 according to the present modification is a rear surface irradiation CMOS image sensor. It is to be noted that the rear surface is one of two major surfaces of the semiconductor substrate 150, and is the surface on the opposite side of the major surface which is provided with the multi-layer wiring layer 160. In the imaging device 17 according to the present modification, light is incident to the rear surface side of the semiconductor substrate 150.

As illustrated in FIG. 9, the imaging device 17 according to the present modification includes a photodiode PD instead of the photoelectric conversion element 210. The photodiode PD is an example of the photoelectric converter that generates an electric charge according to incident light. The photodiode PD is, for instance, a photodiode having p-n junction. The p-n junction is formed by an impurity region formed within the semiconductor substrate 150.

In the present modification, a transfer transistor 28 is provided between the photodiode PD, the diffusion FD, the capacitor 200 and the amplifying transistor 24. The transfer transistor 28 is an example of a switching device that controls the transfer of electric charge generated by the photodiode PD. Specifically, when the transfer transistor 28 is in a conductive state, the electric charge generated by the photodiode PD are transferred to and stored in the diffusion region FD and the capacitor 200. In this state, the selection transistor 26 is turned on, thus a voltage signal according to the electric charge stored in the diffusion region FD and the capacitor 200 is read from the vertical signal line 48. A contact 300 is connected to the gate of the amplifying transistor 24 and the conductive line 171. The contact 300 is an example of a second contact. The conductive line 171 is an example of a first wiring.

Although the reset transistor 22 is not illustrated in FIG. 9, the imaging device 17 may include the reset transistor 22.

In this manner, also in the present modification, the signal charge generated by the photodiode PD is stored in the capacitor 200, thus the saturation level of the photodiode PD can be increased. Therefore, the dynamic range of the imaging device 17 can be increased.

Third Modification

Figure 10:
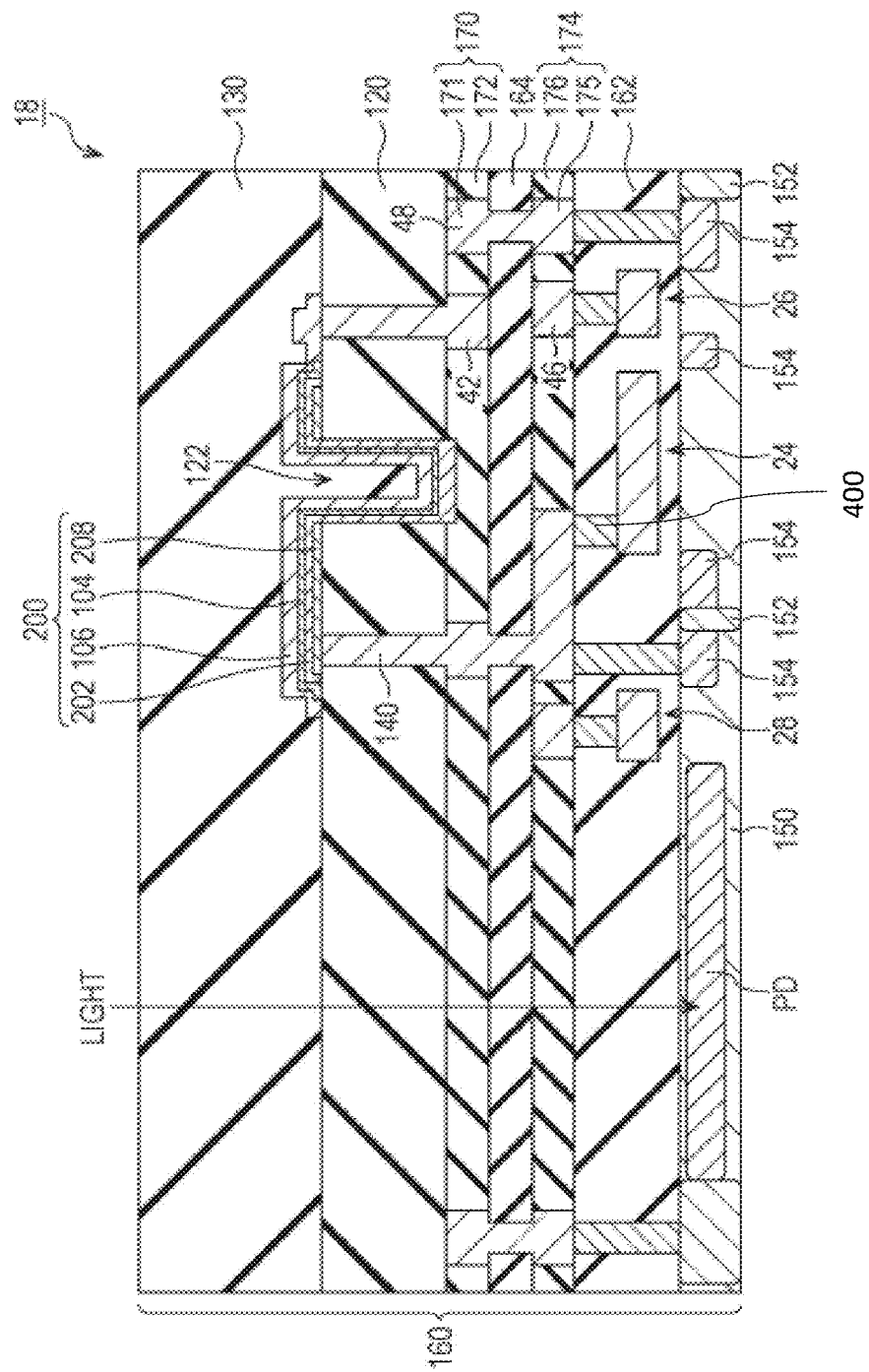
FIG. 10 is a cross-sectional view of a pixel of an imaging device according to a third modification of the third embodiment.

Subsequently, a third modification of the third embodiment will be described with reference to FIG. 10. FIG. 10 is a cross-sectional view of a pixel 20 of an imaging device 18 according to the present modification. In the description of the present modification, a point of difference from the third embodiment will be mainly described, and a description of a common point is omitted or simplified.

The imaging device 18 according to the present modification is a front surface irradiation CMOS image sensor. As illustrated in FIG. 10, in the present modification, light is incident to the photodiode PD via the front surface side of the semiconductor substrate 150, that is, via the multi-layer wiring layer 160. Thus, the capacitor 200 provided in the multi-layer wiring layer 160 is not provided directly above the photodiode PD so as not to block incident light. For instance, the capacitor 200 is provided directly above the transfer transistor 28, the amplifying transistor 24 and the selection transistor 26. A contact 400 is connected to the gate of the amplifying transistor 24 and the conductive line 175. The contact 400 is an example of a second contact. The conductive line 175 is an example of a first wiring.

Although FIG. 10 illustrates the case where one trench 122 is provided in the insulating layer 120, similarly to other modifications and modifications, multiple trenches 122 may be provided.

As described above, also in the present modification, the signal charge generated by the photodiode PD is stored in the capacitor 200, thus the saturation level of the photodiode PD can be increased. Therefore, the dynamic range of the imaging device 18 can be increased.

Other Embodiments

Although the electronic devices according to one or multiple aspects have been described above based on the embodiments. However, the present disclosure is not limited to those embodiments. The embodiments to which various alterations which will occur to those skilled in the art are made, and an embodiment constructed by a combination of components of different embodiments without departing from the spirit of the present disclosure are also included within the scope of the present disclosure.

For instance, in the aforementioned embodiments, an example in which the electronic device is an imaging device has been described. However, this is not always the case. The electronic device may be a storage device that includes one or more capacitors 100 or capacitors 200. The storage device includes, for instance, multiple capacitors 100 or capacitors 200 provided above the semiconductor substrate, and multiple read registers for reading the electric charge stored in each of the multiple capacitors 100 or capacitors 200. Since the capacity of the capacitor 100 or the capacitors 200 is increased with a saved area, miniaturization of the storage device can be achieved.

For instance, the dielectric layer 104 may be positioned inside of the lower electrode 102 in a plan view. In other words, the dielectric layer 104 does not need to completely cover the lower electrode 102. In addition, the upper electrode 106 may be positioned inside of the dielectric layer 104. In other words, the upper electrode 106 does not need to completely cover the dielectric layer 104.

For instance, when the photoelectric conversion element 210 is provided above the capacitors 100 or the capacitors 200, the pixel electrode 214 and the upper electrode 106 may be directly connected by a conductive plug.

For instance, the number of wiring layers included in the multi-layer wiring layer 160 may be one, three or more.

For instance, the dielectric layer 104 of the capacitors 100 or the capacitors 200 may be an insulating film, such as a silicon oxide film or a silicon nitride film, rather than a thin film using a high-k material.

Various modifications, replacements, additions, and omissions may be made to the embodiments described above within the scope of the claims and the scope of the equivalents thereof.

What is claimed is:

1. An imaging device comprising:
   a semiconductor substrate;
   a photoelectric converter that is embedded in the semiconductor substrate and that generates a signal charge by photoelectric conversion;
   a first diffusion region that stores the signal charge transferred from the photoelectric converter;
   a capacitor that stores the signal charge generated by the photoelectric converter;
   a first contact that is connected to the first diffusion region; and
   a first wiring layer that is located between the semiconductor substrate and the capacitor, the first wiring layer including first wiring that is connected to the first contact.

2. The imaging device according to claim 1, further comprising:
   an amplifying transistor that includes a gate and that outputs a signal corresponding to the signal charge in the first diffusion region; and
   a second contact that is connected to the gate of the amplifying transistor and the first wiring.

3. The imaging device according to claim 1, wherein the first wiring layer is disposed between the capacitor and the photoelectric converter.

4. The imaging device according to claim 1, wherein the capacitor has a trench structure.

5. The imaging device according to claim 1, further comprising:
   a second wiring layer, wherein
   no wiring layer is located between the first wiring layer and the semiconductor substrate.

6. The imaging device according to claim 5, further comprising:
   an amplifying transistor that includes a gate and that outputs a signal corresponding to the signal charge in the first diffusion region, wherein the first wiring layer does not include the gate of the amplifying transistor.

7. The imaging device according to claim 1, wherein the imaging device is a back-illuminated CMOS image sensor.

8. The imaging device according to claim 7, wherein the capacitor overlaps at least a part of the photoelectric converter in a plan view.

9. The imaging device according to claim 1, wherein the imaging device is a surface-illuminated CMOS image sensor.

10. The imaging device according to claim 9, wherein the capacitor does not overlap the photoelectric converter in a plan view.

11. The imaging device according to claim 1, wherein the capacitor includes
   a first electrode that is located along an inner wall of at least one recess,
   a dielectric layer that is located on the first electrode, and
   a second electrode that is located on the dielectric layer.

12. The imaging device according to claim 11, wherein the at least one recess includes a plurality of recesses, and the first electrode is located along an inner wall of each of the plurality of recesses.

13. The imaging device according to claim 11, wherein the first wiring layer is located between the semiconductor substrate and a bottom of the at least one recess.

\* \* \* \* \*